United States Patent
Sato et al.

(10) Patent No.: US 7,365,358 B2
(45) Date of Patent: Apr. 29, 2008

(54) SEMICONDUCTOR THIN FILM AND METHOD OF FABRICATING SEMICONDUCTOR THIN FILM, APPARATUS FOR FABRICATING SINGLE CRYSTAL SEMICONDUCTOR THIN FILM, AND METHOD OF FABRICATING SINGLE CRYSTAL THIN FILM, SINGLE CRYSTAL THIN FILM SUBSTRATE, AND SEMICONDUCTOR DEVICE

(75) Inventors: Junichi Sato, Tokyo (JP); Setsuo Usui, Kanagawa (JP); Yasuhiro Sakamoto, Kanagawa (JP); Yoshifumi Mori, Chiba (JP); Hideharu Nakajima, Kanagawa (JP)

(73) Assignee: Sony Corporation, Tokyo (JP)

( * ) Notice: Subject to any disclaimer, the term of this patent is extended or adjusted under 35 U.S.C. 154(b) by 428 days.

(21) Appl. No.: 10/828,882

(22) Filed: Apr. 21, 2004

(65) Prior Publication Data

US 2005/0104125 A1    May 19, 2005

Related U.S. Application Data

(62) Division of application No. 09/946,898, filed on Sep. 5, 2001, now Pat. No. 6,746,942.

(30) Foreign Application Priority Data

| Sep. 5, 2000 | (JP) | ............................ P2000-269261 |
| Sep. 5, 2000 | (JP) | ............................ P2000-269274 |
| Sep. 5, 2000 | (JP) | ............................ P2000-269298 |
| Aug. 10, 2001 | (JP) | ............................ P2001-244163 |

(51) Int. Cl.
*H01L 21/00* (2006.01)

(52) U.S. Cl. ............................ 257/19; 257/64; 438/586

(58) Field of Classification Search ................. 257/19, 257/64; 438/586
See application file for complete search history.

(56) References Cited

U.S. PATENT DOCUMENTS 5,365,875 A    11/1994   Asai et al.

(Continued)

FOREIGN PATENT DOCUMENTS

| JP | 05-160151 | 6/1993 |
| JP | 2000-081642 | 3/2000 |
| JP | 2001-023899 | 1/2001 |
| JP | 2001-244163 | 9/2001 |

OTHER PUBLICATIONS

English Translation of Japanese Published Patent Application No. 12-081642 published Mar. 21, 2000 Kouchi et al by Akiko Smith of the USPTO.

*Primary Examiner*—Laura M. Schillinger
(74) *Attorney, Agent, or Firm*—Sonnenschein Nath & Rosenthal LLP

(57) ABSTRACT

A method of fabricating a single crystal thin film includes forming a non-single crystal thin film on an insulating base; subjecting the non-single crystal thin film to a first heat-treatment, thereby forming a polycrystalline thin film in which polycrystalline grains are aligned in an approximately regular pattern; and subjecting the polycrystalline thin film to a second heat-treatment, thereby forming a single crystal thin film in which the polycrystalline grains are bonded to each other. In this method, either the first heat-treatment or the second heat-treatment may be performed by irradiation of laser beams, preferably, emitted from an excimer laser. A single crystal thin film formed by this fabrication method has a performance higher than a related art polycrystalline thin film and is suitable for fabricating a device having stable characteristics. The single crystal thin film can be fabricated for a short-time by using laser irradiation as the heat-treatments.

12 Claims, 23 Drawing Sheets

U.S. PATENT DOCUMENTS

| | | | |
|---|---|---|---|
| 5,712,496 A | 1/1998 | Takahashi et al. | |
| 5,766,989 A | 6/1998 | Maegawa et al. | |
| 5,817,173 A * | 10/1998 | Nakata | 117/75 |
| 5,824,573 A | 10/1998 | Zhang et al. | |
| 5,849,612 A | 12/1998 | Takahashi et al. | |
| 6,059,873 A | 5/2000 | Yamaguchi et al. | |
| 6,165,875 A | 12/2000 | Fonash et al. | |
| 6,180,957 B1 | 1/2001 | Miyasaka et al. | |
| 6,194,023 B1 | 2/2001 | Mitsuhashi et al. | |
| 6,294,441 B1 | 9/2001 | Yamazaki | |
| 6,323,072 B1 | 11/2001 | Yamazaki et al. | |
| 6,329,270 B1 | 12/2001 | Voutsas | |
| 6,368,945 B1 | 4/2002 | Im | |
| 6,396,147 B1 | 5/2002 | Adachi et al. | |
| 6,411,906 B1 | 6/2002 | Goto | |
| 6,440,824 B1 | 8/2002 | Hayashi et al. | |
| 6,506,669 B1 * | 1/2003 | Kuramasu et al. | 438/586 |
| 6,521,909 B2 * | 2/2003 | Yamaguchi et al. | 257/19 |
| 6,534,353 B1 * | 3/2003 | Kuramasu et al. | 438/197 |
| 6,545,294 B1 * | 4/2003 | Yamaguchi et al. | 257/64 |
| 6,558,998 B2 | 5/2003 | Belleville et al. | |
| 6,608,326 B1 * | 8/2003 | Shinagawa et al. | 257/64 |
| 6,746,942 B2 * | 6/2004 | Sato et al. | 438/586 |
| 6,815,269 B2 * | 11/2004 | Okumura | 438/149 |
| 6,818,922 B2 * | 11/2004 | Chen | 257/66 |
| 6,855,956 B2 * | 2/2005 | Yamazaki et al. | 257/59 |
| 6,884,699 B1 * | 4/2005 | Ogawa et al. | 438/489 |
| 7,087,831 B2 * | 8/2006 | Den et al. | 136/250 |
| 7,164,152 B2 * | 1/2007 | Im | 257/64 |
| 7,235,811 B2 * | 6/2007 | Crowder et al. | 257/64 |
| 7,311,778 B2 * | 12/2007 | Im et al. | 117/200 |
| 2002/0058399 A1 * | 5/2002 | Sato et al. | 438/486 |
| 2005/0104125 A1 * | 5/2005 | Sato et al. | 257/347 |
| 2005/0212137 A1 * | 9/2005 | Yamamoto et al. | 257/758 |

* cited by examiner

F I G. 13
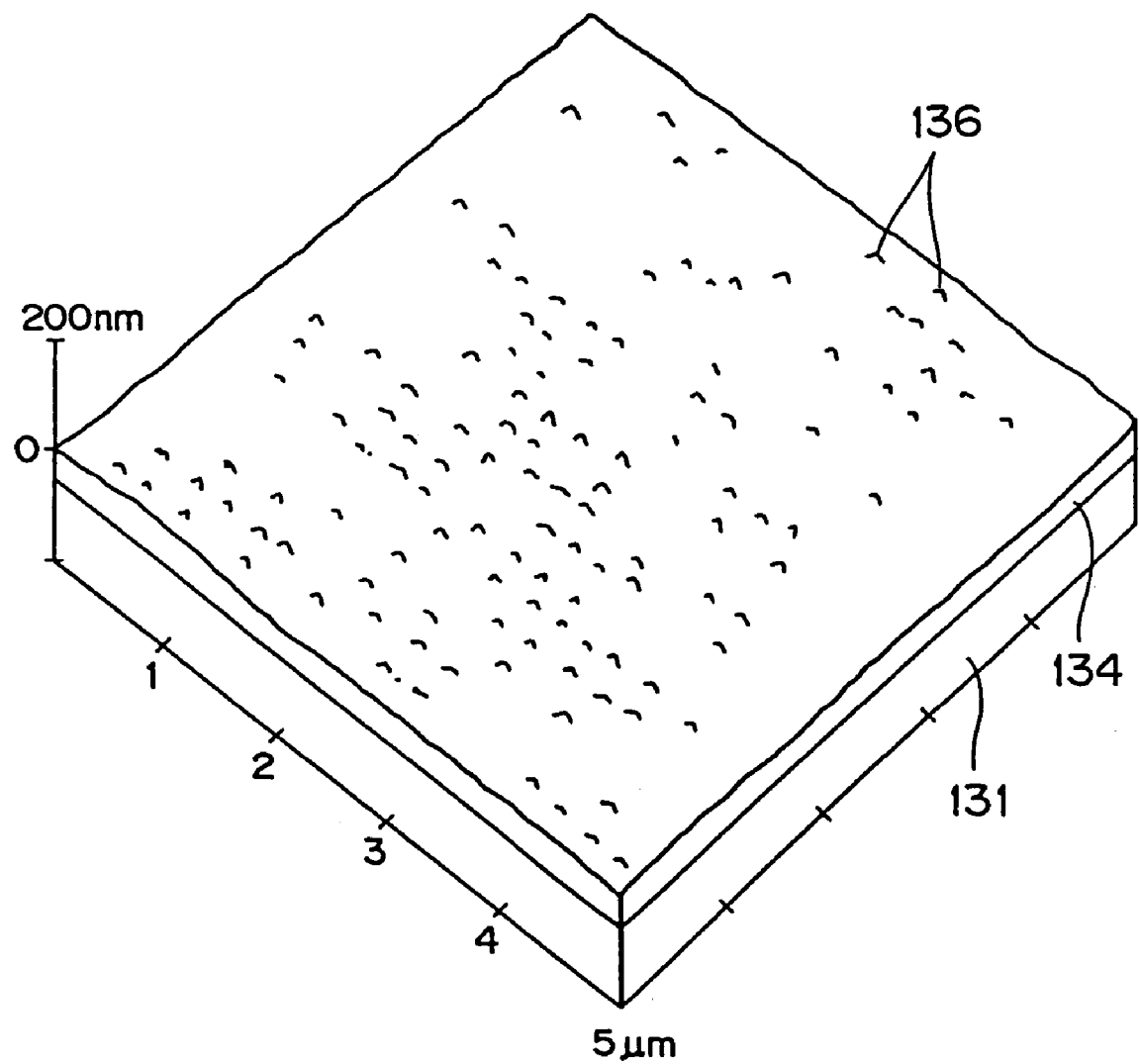

3 μm

3 μm

F I G. 25D
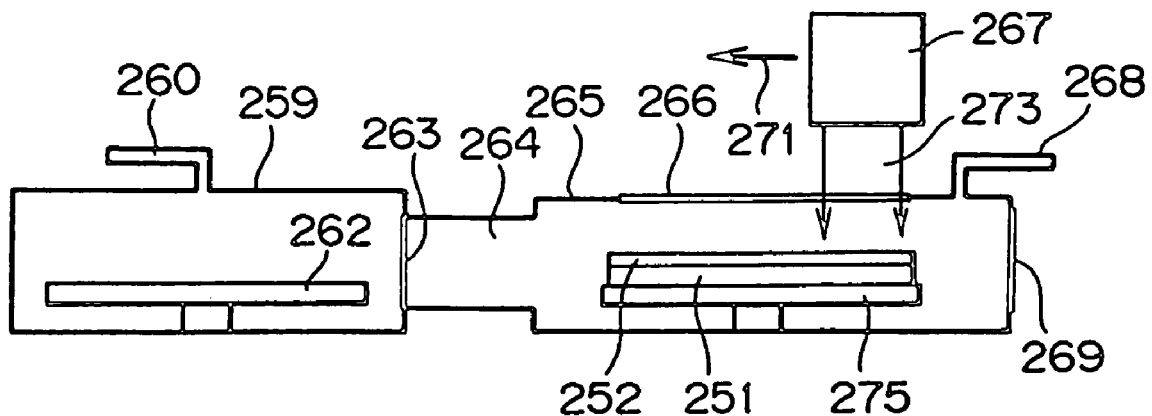
F I G. 25E
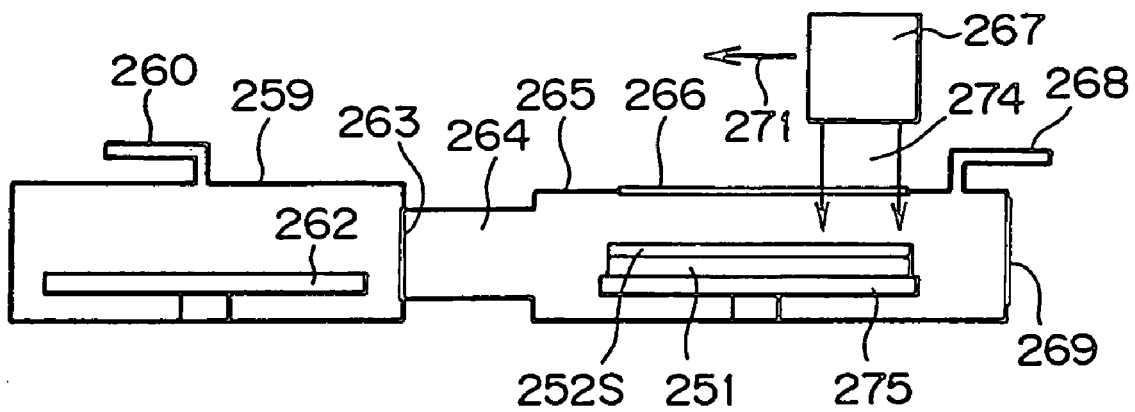
F I G. 25F
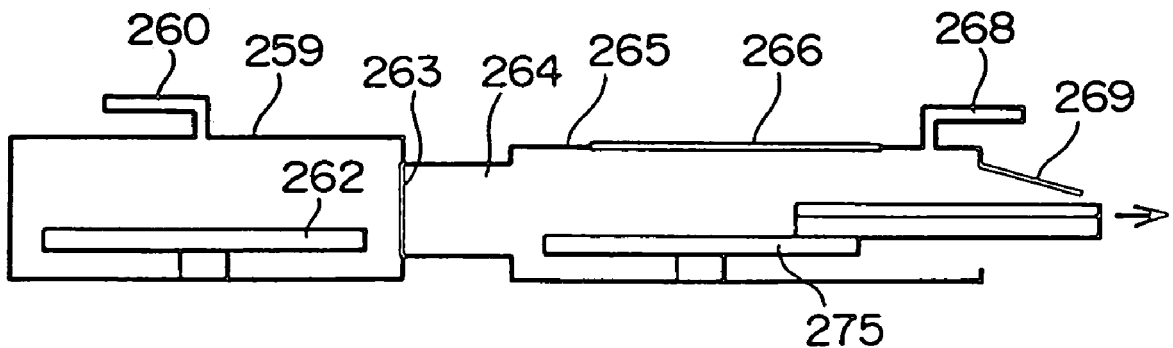

SEMICONDUCTOR THIN FILM AND METHOD OF FABRICATING SEMICONDUCTOR THIN FILM, APPARATUS FOR FABRICATING SINGLE CRYSTAL SEMICONDUCTOR THIN FILM, AND METHOD OF FABRICATING SINGLE CRYSTAL THIN FILM, SINGLE CRYSTAL THIN FILM SUBSTRATE, AND SEMICONDUCTOR DEVICE

This application is a divisional of U.S. patent application Ser. No. 09/946,898 filed Sep. 5, 2001 now U.S. Pat. No. 6,746,942, which claims priority to the Japanese Patent applications P2000-269298, P2000-269274, and P2000-269261, each of which were filed on Sep. 5, 2000, and to Japanese Patent Application P2001-244163 filed on Aug. 10, 2001, all of the aforesaid applications being expressly incorporated by reference in their respective entireties to the extent permitted by law.

BACKGROUND OF THE INVENTION

The present invention relates to a semiconductor thin film applicable to thin film transistors (TFTs) used for liquid crystal displays, memories, and other electronic devices and a fabrication method thereof; an apparatus for fabricating a single crystal semiconductor thin film; and a method of fabricating a single crystal thin film, a single crystal thin film substrate, and a semiconductor device using the substrate.

As semiconductor thin films such as silicon thin films formed on insulating substrates, there have been known an SOI (Silicon On Insulator) structure, and amorphous silicon thin films or polycrystalline silicon thin films formed on glass substrates which have been practically used for liquid crystal displays.

The SOI structure is often formed by way of various steps including a step of sticking single crystal silicon wafers to each other and a step of polishing them, and since the SOI structure basically uses a single crystal silicon wafer, a substantially perfect single crystal portion of the SOI structure can be typically used for a channel portion of an active device of a thin film transistor (TFT). Accordingly, the device thus fabricated can exhibit good electronic characteristics, for example, a high mobility. The method of fabricating the SOI structure, however, requires various steps, for example, a step of sticking single crystal silicon wafers to each other and a step of polishing them, thereby causing disadvantages that the number of steps is increased to prolong the production time, and also the production cost is raised.

On the contrary, there has been known a method of forming a crystallized silicon thin film by depositing a source gas obtained by mixing hydrogen and $SiF_4$ to silane gas on a substrate in accordance with a low-pressure CVD process or a plasma CVD process, and a method of forming a crystallized silicon thin film by forming an amorphous silicon thin film as a precursor on a substrate and crystallizing the amorphous silicon thin film. In the former deposition method in which crystallization of silicon proceeds along with deposition of the silicon thin film, since the substrate temperature is required to be kept at a relatively high temperature, more specifically, 600° C. or more, the substrate must be made from an expensive material withstanding a high temperature such as quartz. In this method, the use of an inexpensive glass substrate may give rise to a problem that the substrate may be deformed or distorted because of its poor heat resistance. With respect to the latter method, as a process of crystallizing an amorphous silicon thin film formed on a substrate, there has been known a solid-phase growth process of annealing the substrate, on which the amorphous silicon thin film has been formed, for a long time (for example, 20 hr). Such an annealing process, however, has a problem that since it takes a long time, the practical utility is poor and also the production cost is raised. To solve these problems, there has been actively studied and developed a method of crystallizing a non-single crystal thin film by irradiation of laser beams emitted from an excimer laser.

This laser irradiation method involves forming an amorphous silicon thin film or a polycrystalline silicon thin film on a substrate, and heating the thin film by irradiation of laser beams emitted from an excimer laser, thereby crystallizing the thin film. For example, in the case of using an XeCl excimer laser, since an emission wavelength is 308 nm and an absorption coefficient is about $10^6$ $cm^{-1}$, the laser energy is absorbed in a region having a depth of about 10 nm from the surface of an amorphous silicon thin film, with a result that the substrate temperature is little raised, and only a portion near the surface of the amorphous silicon thin film is crystallized.

The technique of melting a non-single crystal thin film by irradiation of laser beams emitted from an excimer laser and recrystallizing the melted thin film can grow polycrystalline silicon grains in an amorphous silicon thin film or a polycrystalline silicon thin film; however, it is very difficult to stably control a crystal quality of the thus formed thin film on the basis of the number of shots of laser beams, thereby tending to cause a variation in threshold voltage of a thin film transistor as a final product.

By the way, in the case of using a PECVD (Plasma-Enhanced CVD) system for forming an amorphous semiconductor thin film on a substrate, the film contains hydrogen in an amount of about 2 to 20 atomic %. In this case, the substrate on which the thin film has been-formed is put in an electric furnace and is subjected to a degassing treatment, for example, at 420° C. for about 2 hr. The hydrogen concentration in the film is reduced to less than 2 atomic % by the degassing treatment.

Such a degassing (annealing) treatment in an electric furnace for removing hydrogen contained in the film has a problem that since the substrate must be annealed, for example, at 420° C. for about 2 hr, the productivity is degraded, and further, the substrate may be deformed due to heat caused by the degassing treatment and a contaminant from glass may be diffused in the thin film.

SUMMARY OF THE INVENTION

An object of the present invention is to provide a semiconductor thin film which has a performance very higher than that of a related art polycrystalline thin film and is suitable for fabricating a device having stable characteristics and which is fabricated for a sufficiently short time, and a method of and an apparatus for fabricating the semiconductor thin film.

Another object of the present invention is to provide a semiconductor device and a single crystal thin film substrate fabricated by using such a semiconductor thin film having a high crystal quality.

A further object of the present invention is to provide a method of fabricating a semiconductor thin film, which is capable of preventing the explosion of a thin film during fabrication steps and removing hydrogen from the thin film for a short time, and an apparatus for fabricating a single crystal semiconductor thin film.

To solve the above-described problems, the present inventors have found that one of the causes of obstructing the enlargement of sizes of crystal grains in a polycrystalline thin film is dependent on the manner of irradiating the thin film with laser beams, and eventually created an innovative semiconductor thin film quite different from the related art polycrystalline thin film and a fabrication thereof. More specifically, the present inventors have found that a crystallized semiconductor thin film can be formed by crystallizing a non-single crystal thin film by laser irradiation under irradiation conditions such that polycrystalline grains aligned in an approximately regular pattern are formed on the thin film, and heat-treating the thin film with the surface state having projections kept as it is, thereby promoting crystallization of the thin film.

Accordingly, to solve the above-described technical problems, according to a first aspect of the present invention, there is provided a method of fabricating a single crystal thin film, including the steps of: forming a non-single crystal thin film on an insulating base; subjecting the non-single crystal thin film to a first heat-treatment, thereby forming a polycrystalline thin film in which polycrystalline grains are aligned in an approximately regular pattern; and subjecting the polycrystalline thin film to a second heat-treatment, thereby forming a single crystal thin film in which the polycrystalline grains are bonded to each other.

To largely grow a single crystal region in which polycrystalline grains have been bonded to each other, it may be preferred that adjacent polycrystalline grains be in a state being easy to be bonded to each other. From this viewpoint, according to the present invention, since polycrystalline grains are aligned in an approximately regular pattern, it is possible to obtain common crystal directivities of the polycrystalline grains, for example, common crystal orientation planes such as the (100) plane at the time of recrystallization after heat-treatment, and hence to attain smooth bonding of the polycrystalline grains by making use of the order thereof. Accordingly, at the time of heat-treatment, the bonding of the polycrystalline grains will be easily promoted, to convert the polycrystalline film into a single crystal film.

According to a second aspect of the present invention, there is provided a method of fabricating a single crystal thin film, including the steps of: forming a non-single crystal thin film on an insulating base; and irradiating the non-single crystal thin film with laser beams, thereby converting the non-single crystal thin film into a single crystal thin film.

With this configuration, crystals in the non-single crystal thin film are grown into a single crystal film by irradiating the non-single crystal thin film with laser beams, whereby the non-single crystal thin film is converted into the single crystal thin film.

According to a third aspect of the present invention, there is provided a method of fabricating a single crystal thin film, including the steps of: forming a non-single crystal thin film on an insulating base; subjecting the non-single crystal thin film to a first heat-treatment, to introduce a common boundary condition, thereby forming a polycrystalline thin film; and subjecting the polycrystalline thin film to a second heat-treatment, thereby forming a single crystal thin film in which polycrystalline grains are crystallized.

With this configuration, since the common boundary condition is introduced to the polycrystalline grains by the first heat-treatment, it is possible to obtain common crystal directivities of the polycrystalline grains, for example, common crystal orientation planes such as the (100) plane at the time of recrystallization after the first heat-treatment, and hence to attain smooth bonding of the polycrystalline grains by making use of the order thereof. Accordingly, at the time of the second heat-treatment, the bonding of the polycrystalline grains can be easily promoted, to convert the polycrystalline film into a single crystal film.

According to a fourth aspect of the present invention, there is provided a single crystal thin film substrate including: an insulating base; and a single crystal thin film formed on the insulating base by single-crystallization using laser irradiation. With this configuration, the crystallization for forming the single crystal thin film substrate is performed by aligning polycrystalline grains in a polycrystalline thin film in an approximately regular pattern, and heat-treating the polycrystalline thin film.

According to a fifth aspect of the present invention, there is provided a semiconductor device formed by using the above single crystal thin film substrate.

According to a sixth aspect of the present invention, there is provided a semiconductor thin film formed on an insulating base, including: micro-projections formed on the surface of the semiconductor thin film.

The micro-projections on the semiconductor thin film according to the present invention are portions where boundaries of polycrystalline grains in the polycrystalline thin film, formed during fabrication steps, collide with and overlap each other. Such micro-projections can be observed by a microscopic photograph as will be described later. The height of each micro-projection may be in a range of 20 nm or less, preferably, 10 nm or less, more preferably, 5 nm or less; the diameter of each micro-projection may be in a range of 0.1 μm or less, preferably, 0.05 μm or less; and a radius of curvature of each micro-projection may be in a range of 60 nm or more, preferably, 180 nm or more, more preferably, 250 nm or more. The density of micro-projections is in a range of $1\times10^{10}$ pieces/cm$^2$ or less, preferably, $1\times10^9$ pieces/cm$^2$ or less, more preferably, $5\times10^8$ pieces/cm$^2$ or less. The size of a single crystal region may be in a range of $1\times10^{-8}$ cm$^{-2}$ or more, preferably, $1\times10^{-7}$ cm$^{-2}$ or more. The single crystal region is not required to be formed on the entire surface of an insulating base but may be present on part of a polycrystalline thin film.

According to a seventh aspect of the present invention, there is provided a method of fabricating a semiconductor thin film, including the steps of: forming a non-single crystal thin film on an insulating base; subjecting the non-single crystal thin film to a first heat-treatment, thereby forming a polycrystalline thin film; and subjecting the polycrystalline thin film to a second heat-treatment, thereby forming a crystallized semiconductor thin film; wherein projections on the surface of the crystallized semiconductor thin film are lower than projections on the surface of the polycrystalline thin film.

With this configuration, at the first heat-treatment, the projections are formed on the surface of the polycrystalline thin film. The projections uplifted from the surface are formed by overlapping boundaries of the polycrystalline grains. The heat-treatment for forming the projections on the surface of the polycrystalline is exemplified by irradiation of laser beams emitted from an excimer laser. At the second heat-treatment, the projections on the surface of the single crystal thin film are lower than the projections on the surface of the polycrystalline thin film, so that at least part of the portions where the boundaries are overlapped to each other substantially disappear. This makes it possible to obtain a thin film including a single crystal region having an excellent crystal quality.

According to an eighth aspect of the present invention, there is provided a method of fabricating a semiconductor thin film, including the steps of: forming a non-single crystal thin film on an insulating base; subjecting the non-single crystal thin film to a first heat-treatment, thereby forming a polycrystalline thin film; and subjecting the polycrystalline thin film to a second heat-treatment, thereby forming a crystallized semiconductor thin film; wherein a radius of curvature of each of projections on the surface of the crystallized semiconductor thin film is larger than a radius of curvature of each of projections on the surface of the polycrystalline thin film.

With this configuration, at the second heat-treatment, the radius of curvature of each of the projections on the surface of the crystallized semiconductor thin film is larger than the radius of curvature of each of the projections on the surface of the polycrystalline thin film, so that at least part of the portions where the boundaries are overlapped to each other substantially disappear. This makes it possible to obtain a semiconductor thin film having an excellent crystal quality.

According to a ninth aspect of the present invention, there is provided a method of fabricating a semiconductor thin film, including the steps of: forming a non-single crystal thin film on an insulating base; subjecting the non-single crystal thin film to a first heat-treatment, thereby forming a polycrystalline thin film in which polycrystalline grains are aligned in an approximately regular pattern; and subjecting the polycrystalline thin film to a second heat-treatment, thereby forming a semiconductor thin film in which micro-projections are each formed at a boundary position among at least three or more of the polycrystalline grains; wherein a height of each of the micro-projections is in a range of 25 nm or less or a radius of curvature of each of the micro-projections is in a range of 60 nm or more.

With this configuration, the polycrystalline thin film, in which the polycrystalline grains have been aligned in an approximately regular pattern by the first heat-treatment, is then subjected to the second heat-treatment. Accordingly, at least part of the portions where the boundaries are overlapped to each other substantially disappear. This makes it possible to obtain a crystallized semiconductor thin film having an excellent crystal quality.

According to a tenth aspect of the present invention, there is provided each of a semiconductor device and a substrate using the above single crystal thin film having micro-projections as part of the structure.

According to an eleventh aspect of the present invention, there is provided a method of fabricating a semiconductor thin film on a base, including the steps of: forming a hydrogen containing non-single crystal semiconductor thin film; subjecting the hydrogen containing non-single crystal thin film to a first heat-treatment, thereby removing hydrogen therefrom; continuously subjecting the non-single crystal thin film from which hydrogen has been removed to a second heat-treatment, thereby forming a polycrystalline film in which polycrystalline grains are aligned in an approximately regular pattern.

With this configuration, since the polycrystalline film in which polycrystalline grains are almost aligned is formed by the second heat-treatment, the crystallized semiconductor thin film in which crystallization has proceeded can be formed. After hydrogen is removed by the first heat-treatment, the polycrystalline film is formed by the second heat-treatment which is continuous to the first heat-treatment. Accordingly, it is possible to eliminate the need of opening the substrate to atmosphere and hence to shorten the time required for the first and second heat-treatments. Further, since removal of hydrogen is performed prior to heat-treatment, it is possible to prevent the explosion of the film.

According to a twelfth aspect of the present invention, there is provided a method of fabricating a semiconductor thin film on a base, including the steps of: forming a hydrogen containing non-single crystal semiconductor thin film; subjecting the hydrogen containing non-single crystal thin film to a first heat-treatment, thereby removing hydrogen therefrom; continuously subjecting the non-single crystal thin film from which hydrogen has been removed to a second heat-treatment, thereby melting and recrystallizing the non-single crystal thin film; and subjecting a polycrystalline film formed by melting and recrystallization to a third heat-treatment, thereby converting the polycrystalline film into a single crystal film.

With this configuration, after the non-single crystal thin film is melted and recrystallized, the third heat-treatment is performed to convert the polycrystalline film formed by melting and recrystallization into a single crystal film. After hydrogen is removed, the second heat-treatment is continuously performed. Accordingly, it is possible to eliminate the need of opening the substrate to atmosphere and hence to shorten the time required for the first and second heat-treatments. Further, since removal of hydrogen is performed prior to heat-treatment, it is possible to prevent the explosion of the film.

According to a thirteenth aspect of the present invention, there is provided an apparatus for fabricating a single crystal semiconductor thin film on a base, including: thin film forming means for forming a hydrogen containing non-single crystal thin film on the base; first heat-treatment means for subjecting the hydrogen containing non-single crystal thin film to a first heat-treatment, thereby removing hydrogen therefrom; and second heat-treatment means for continuously subjecting the non-single crystal thin film from which hydrogen has been removed to a second heat-treatment, thereby melting and recrystallizing the non-single crystal thin film.

According to a fourteenth aspect of the present invention, there is provided an apparatus for fabricating a single crystal semiconductor thin film on a base, including: thin film forming means for forming a hydrogen containing non-single crystal thin film on the base; first heat-treatment means for subjecting the hydrogen containing non-single crystal thin film to a first heat-treatment, thereby removing hydrogen therefrom; and second heat-treatment means for continuously subjecting the non-single crystal thin film from which hydrogen has been removed to a second heat-treatment, thereby forming a polycrystalline film; and third heat-treatment means for subjecting the polycrystalline film to a third heat-treatment, thereby converting the polycrystalline film into a single crystal film.

With these configurations, after hydrogen is removed, the second heat-treatment is continuously performed. Accordingly, it is possible to eliminate the need of opening the substrate to atmosphere and hence to shorten the time required for the first and second heat-treatments.

BRIEF DESCRIPTION OF THE DRAWINGS

FIG. 13 is a perspective sectional view illustrating a step of forming a crystallized semiconductor thin film in the one example of the method of fabricating a semiconductor thin film according to the present invention;

FIGS. 25A to 25F are sectional views illustrating steps of fabricating a semiconductor thin film according to the eighth embodiment of the present invention and states of the fabricating apparatus in the steps, wherein FIG. 25A shows a CVD step; FIG. 25B shows a substrate carrying step; FIG. 25C shows a degassing step; FIG. 25D shows a step of converting an amorphous film into a polycrystalline film; FIG. 25E shows a step of converting the polycrystalline film into a single crystal film; and FIG. 25F shows a substrate discharging step.

DETAILED DESCRIPTION OF THE PREFERRED EMBODIMENTS

Hereinafter, preferred embodiments of the present invention will be described with reference to the accompanying drawings.

First, first and second embodiments of the present invention, which relate to a method of fabricating a single crystal thin film, a single crystal thin film substrate, and a semiconductor device using the substrate as part of the structure thereof, will be described with reference to the drawings.

First Embodiment

A method of fabricating a single crystal thin film according to the present invention includes the step of forming a non-single crystal thin film on an insulating base, the step of subjecting the non-single crystal thin film to a first heat-treatment, thereby forming a polycrystalline thin film in which polycrystalline grains are aligned in an approximately regular pattern, and the step of subjecting the polycrystalline thin film to a second heat-treatment, to bond the polycrystalline grains to each other, thereby forming a single crystal thin film.

Figure 1:
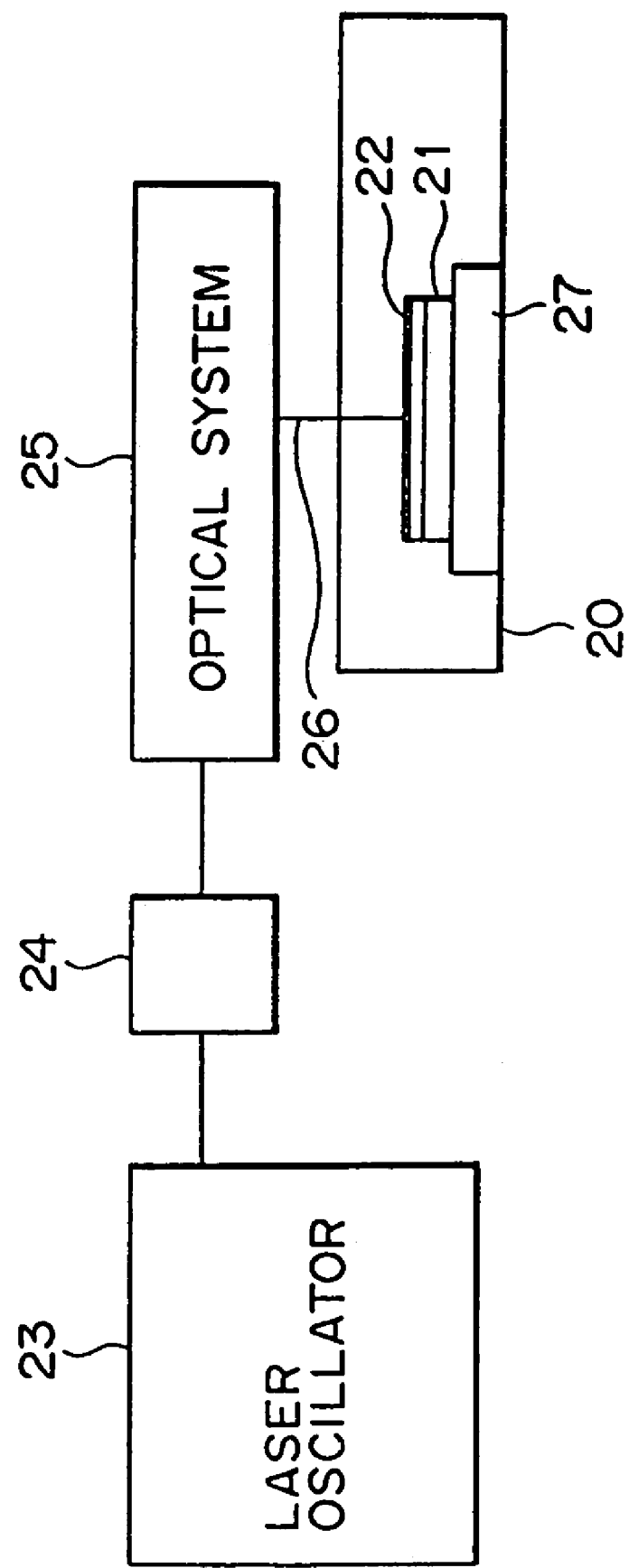
FIG. 1 is a schematic diagram of an excimer laser irradiation apparatus used for a method of fabricating a single crystal thin film according to the present invention.

The method of fabricating a single crystal thin film according to the present invention will be described hereinafter with reference to FIGS. 1 to 6. FIG. 1 shows one example of an excimer laser irradiation apparatus used for the method of fabricating a semiconductor thin film as a single crystal thin film according to the present invention. First, there will be described the excimer laser irradiation apparatus used for irradiating a semiconductor thin film 22 formed on an insulating substrate 21 having a low heat resistance such as a glass substrate with excimer laser beams. The insulating substrate 21 having a low heat resistance, on which the semiconductor thin film 22 has been formed, is mounted in a chamber 20. The excimer laser irradiation apparatus has a laser oscillator 23, an attenuator 24, and an optical system 25 including a homogenizer, which components are all arranged outside the chamber 20. A stage 27 movable in the XY directions is provided in the chamber 20. The insulating substrate 21 having the semiconductor thin film 22 formed thereon is mounted on the stage 27. The laser oscillator 23 includes an excimer laser source, which intermittently emits a laser beam 26 having a pulse width of 60 nanoseconds or more. The optical system 25 including the homogenizer receives the laser beam emitted from the laser oscillator 23 via the attenuator 24, shapes the laser beam into a rectangular cross-section having four sides each having a length of 10 mm or more, and irradiates the semiconductor thin film 22 with the laser beam thus shaped. The attenuator 24 adjusts the energy of the laser beam emitted from the laser oscillator 23. The optical system 25 not only shapes the laser beam into a rectangular cross-section but also adjusts the laser beam so that the energy of the laser beam is uniformly distributed in the rectangular cross-section. The interior of the chamber 20 is kept in an inert gas atmosphere such as nitrogen gas. At the time of irradiation of the laser beams 26, the stage 27 is moved so that the end portions of the laser beams 26 are overlapped to each other. The surface of the semiconductor thin film 22 is intermittently irradiated in sequence with such laser beams 26. The semiconductor thin film 22 formed on the principal plane of the insulating substrate 21 mounted in the chamber 20 of the excimer laser irradiation apparatus is an amorphous silicon film formed by a plasma CVD system.

Any excimer laser may be used for the laser oscillator 23 insofar as it allows formation of a semiconductor thin film in a surface state with micro-projections. For example, there may be used one or more excimer lasers selected from KrF, XeCl, XeF and ArF lasers.

Excimer lasers can be broadly divided into two types: those for irradiation of line beam laser, and those for irradiation of rectangular beam laser. The excimer laser for irradiation of line beam laser emits laser beams each having a linear pattern. In the case of irradiating a region having a specific spread with the excimer laser for irradiation of line beam laser, the substrate side or the laser source side is moved in a specific direction. To be more specific, the region is irradiated with line beam laser by overlapping the irradiation of the line beam laser in the scanning direction perpendicular to the longitudinal direction of laser irradiation. The excimer laser for irradiation of rectangular beam laser emits laser beams each having a planar pattern. A region with a spread is irradiated with rectangular beam laser by moving the substrate side or laser source side while overlapping the end portions of irradiated areas to each other. As the excimer laser for irradiation of line beam laser, there can be typically used an excimer laser having an energy density of 350 mJ/cm² and a pulse width being as relatively short as about 20 nanoseconds. Such an excimer laser is, for example, sold by Lambda Physik GmbH. On the other hand, as the excimer laser for irradiation of rectangular beam laser, there can be typically used an excimer laser having an energy density of 480 mJ/cm² and a pulse width being as relatively long as about 150 to 200 nanoseconds. Such an excimer laser is, for example, sold by Sopra.

Figure 2:
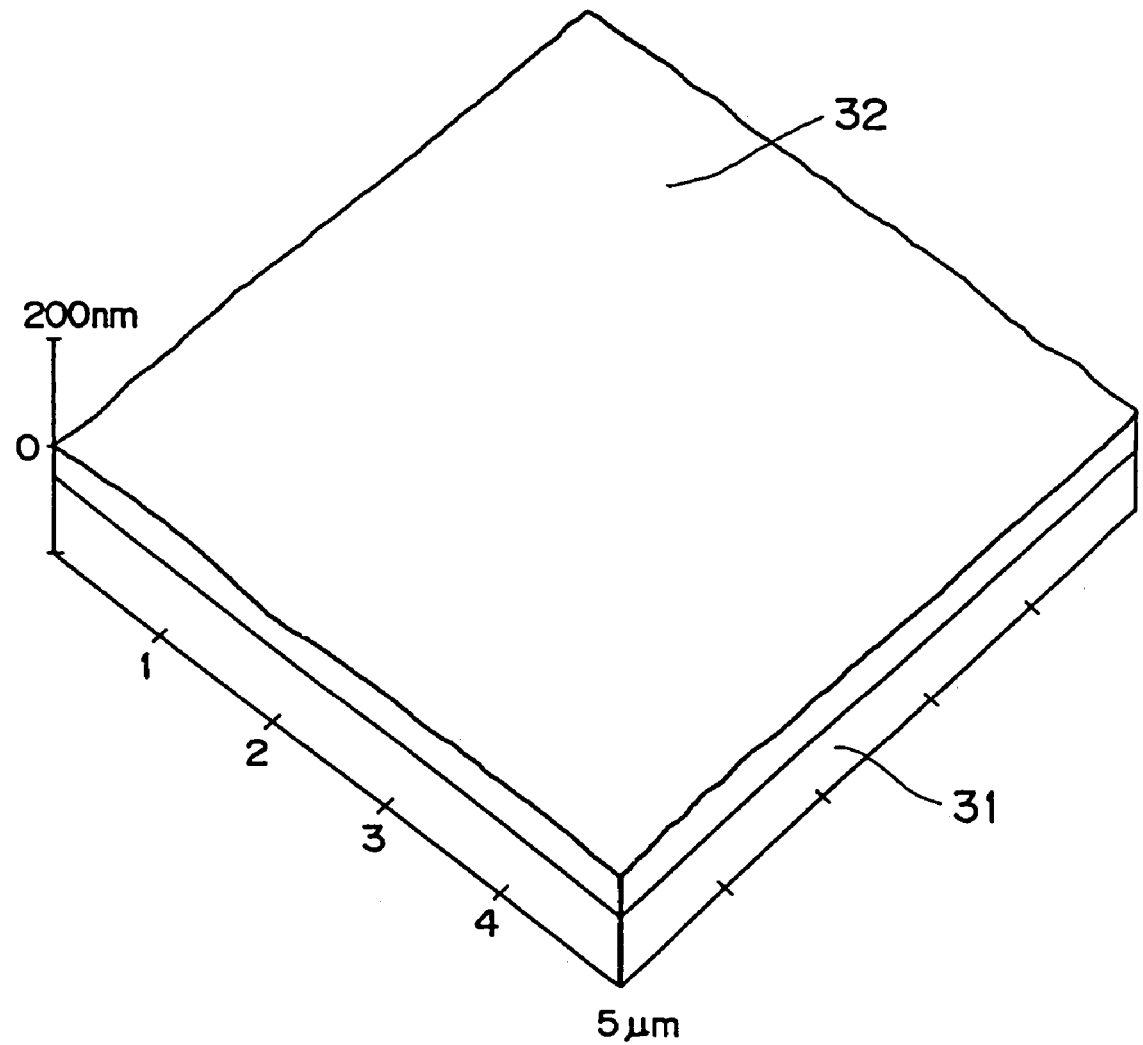
FIG. 2 is a perspective sectional view illustrating a step of forming an amorphous semiconductor thin film in one example of the method of fabricating a single crystal thin film according to the present invention.
Figure 3:
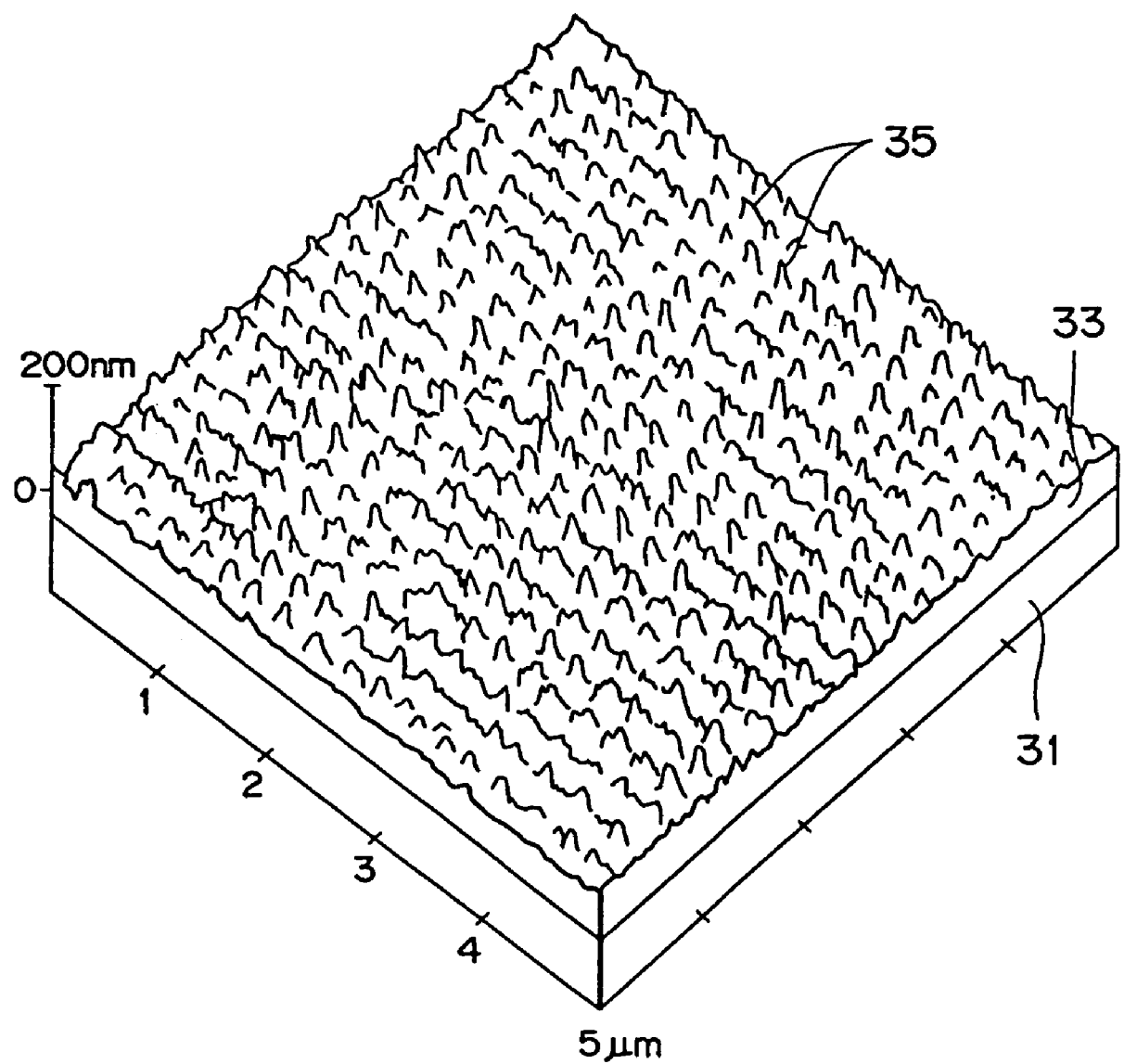
FIG. 3 is a perspective sectional view illustrating a step of forming a polycrystalline semiconductor thin film in the one example of the method of fabricating a single crystal thin film according to the present invention.

One example of the method of fabricating a semiconductor thin film according to the present invention will be described below with reference to FIGS. 2 to 6. Referring first to FIG. 2, an insulating substrate 31 made from glass, quartz, ceramic, or sapphire is prepared, and an amorphous semiconductor thin film 32 is formed on a principal plane of the insulating substrate 31, for example, by a plasma-enhanced CVD process. As the insulating substrate 31, there may be used a so-called white glass having a low heat resistance (low melting point) because an excimer laser is used as a light source. As the amorphous semiconductor thin film 32, an amorphous silicon film may be formed, for example, by the plasma-enhanced CVD process. The thickness of the amorphous semiconductor thin film 32, which is typically set to about 50 nm, may be suitably adjusted in accordance with characteristics of a semiconductor device to be fabricated. As one example, the thickness of the amorphous semiconductor thin film 32 may be set in a range of about 500 nm or less, generally, in a range of about 100 nm or less, preferably, 80 nm or less, more preferably, 60 nm or less.

After formation of the amorphous semiconductor thin film 32, the insulating substrate 31, on which the amorphous semiconductor thin film 32 has been formed, is mounted to the excimer laser irradiation apparatus shown in FIG. 1, and is then subjected to irradiation of excimer laser beams as a first heat-treatment. The laser irradiation is performed by using an XeCl excimer laser having a wavelength of 308 nm under conditions that the energy intensity is set to 340 mJ/cm² and the overlap ratio in the scanning direction is set to 95%. With this laser irradiation, the amorphous semiconductor thin film 32 is melted and recrystallized, to form a polycrystalline semiconductor thin film 33 composed of polycrystalline grains being substantially aligned. Each of the polycrystalline grains in the polycrystalline semiconductor thin film 33 has an approximately rectangular shape whose diagonal line has a length of about 0.2 μm to 0.6 μm. Crystal grain boundaries are also formed by irradiation of excimer laser beams. In a grain boundary portion, each micro-projection 35 caused by uplift of crystals due to mutual collision thereof exists at a boundary position among at least three or more polycrystalline grains. The height of the micro-projection 35 is about 50 nm at maximum, and is generally in a range of 25 nm or more.

Figure 5:
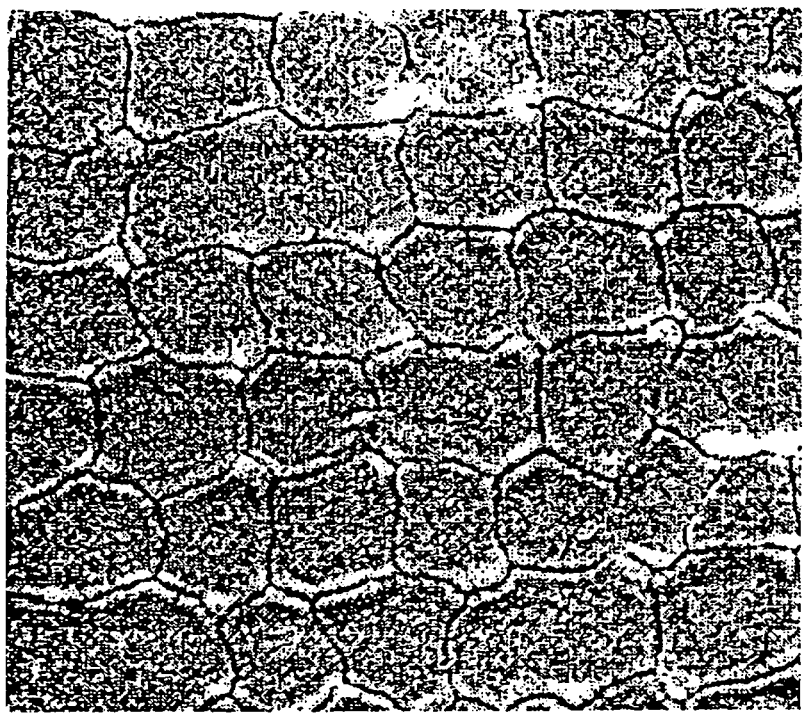
FIG. 5 is a scanning electron microscope (SEM) photograph of the polycrystalline semiconductor thin film converted from the amorphous semiconductor thin film in the one example of the method of fabricating a single crystal thin film according to the present invention.

FIG. 5 is an SEM (Scanning Electron Microscope) photograph of the polycrystalline semiconductor thin film 33 converted from the amorphous semiconductor thin film 32 by laser irradiation. As shown in this photograph, polycrystalline grains (polysilicon grains) developed in a crocodile skin like shape are aligned in an approximately regular pattern in the horizontal and vertical directions, and a plurality of micro-projections are each formed at a boundary position among at least three or more polycrystalline grains. The alignment of polycrystalline grains in an approximately regular pattern may be considered to occur when a periodical pattern is given to the intensities of laser beams. In the case of irradiation of line beam laser, such a periodical pattern can be given to the intensities of the line beam laser by a diffraction phenomenon at opening portions and the like at the time of irradiation of the line beam laser; and in the case of irradiation of planer laser beams, the periodical pattern can be given to the intensities of the rectangular beam laser by an interference or diffraction phenomenon of an intensity modulation mask such as a phase shift mask at the time of irradiation of the rectangular beam laser. More comprehensively, it may be considered that a common boundary condition be introduced to polycrystalline grains by laser irradiation. In order to largely grow a single crystal region in which polycrystalline grains have been bonded to each other, it may be preferred that adjacent polycrystalline grains be in a state being liable to be bonded to each other. To obtain such a state that adjacent polycrystalline grains are liable to bonded to each other, according to this embodiment, the first heat-treatment is made to form polycrystalline grains aligned in an approximately regular pattern, and thereby to obtain common crystal directivities of the polycrystalline grains, for example, common crystal orientation planes such as the (100) plane at the time of recrystallization after heat-treatment. The polycrystalline grains aligned in the approximately regular pattern after the first heat-treatment will be thus smoothly bonded to each other on the basis of the order thereof. Accordingly, at the next second heat-treatment, the mutual bonding of the polycrystalline grains will be easily promoted, to convert the polycrystalline film into a single crystal film.

Following the first heat-treatment by laser irradiation, a second heat-treatment is made by irradiation of excimer laser beams. The laser irradiation is performed by using an XeCl excimer laser having a wavelength of 308 nm under conditions that the energy intensity is set to 300 mJ/cm$^2$ and the overlap ratio in the scanning direction is set to 95%. The energy intensity of the excimer laser used for laser irradiation as the second heat-treatment is lower than the energy intensity of the excimer laser used for laser irradiation as the first heat-treatment, so that the heat-treatment temperature of the polycrystalline semiconductor thin film 33 becomes lower than the heat-treatment temperature at the time of laser irradiation as the first heat-treatment. It should be noted that the heat-treatment temperature of the polycrystalline semiconductor thin film 33 is set to be lower than the melting point of polycrystalline silicon.

Figure 4:
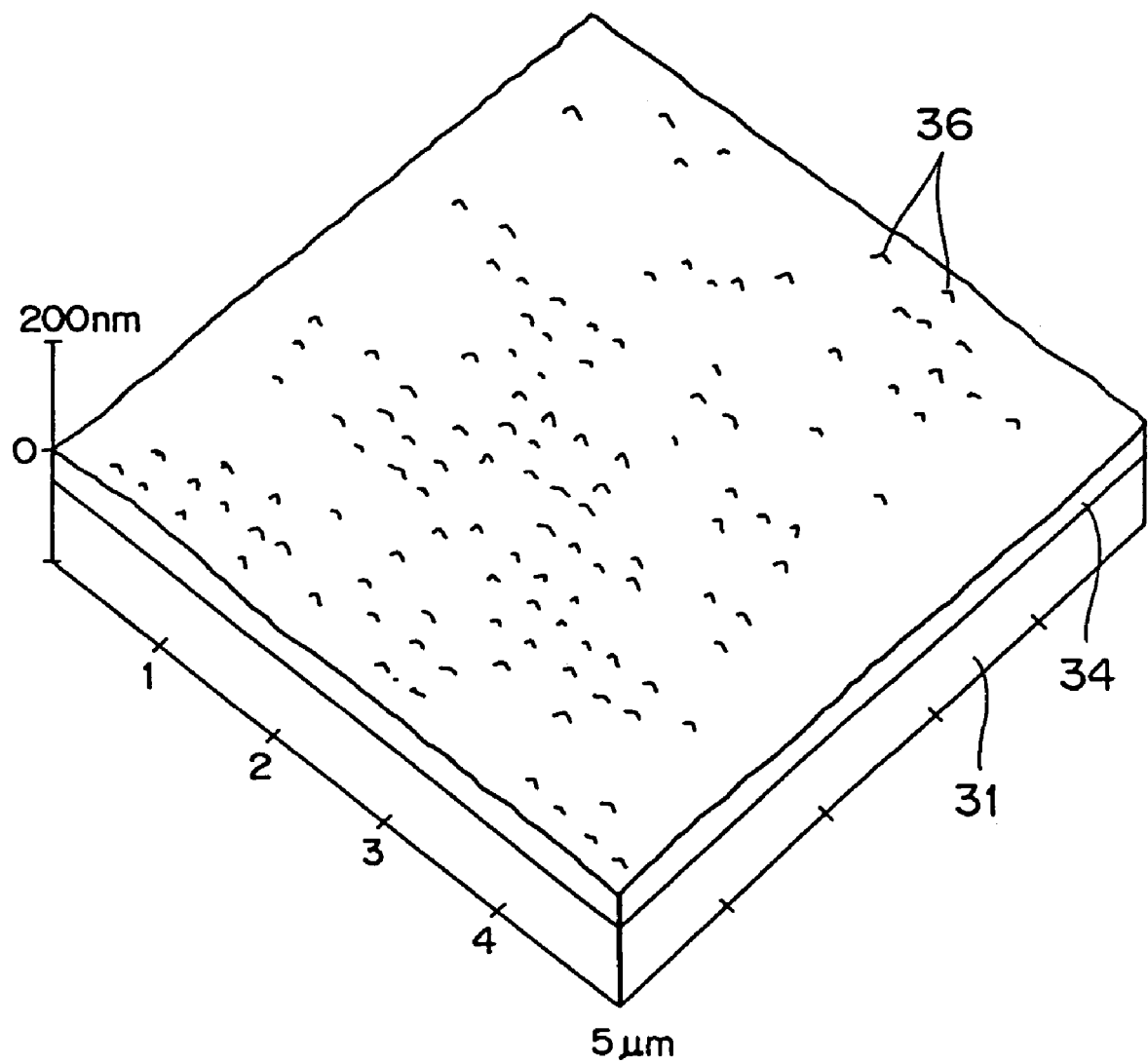
FIG. 4 is a perspective sectional view illustrating a step of forming a single crystal thin film in the one example of the method of fabricating a single crystal thin film according to the present invention.

The polycrystalline semiconductor thin film 33 is, as shown in FIG. 4, converted into a single crystal thin film 34 by irradiation of excimer laser beams as the second heat-treatment. To be more specific, the adjacent polycrystalline grains in the polycrystalline semiconductor thin film 33 formed by the first heat-treatment are bonded to each other by irradiation of excimer laser beams, to form the single crystal thin film 34 which includes a single crystal region having a size of at least $1 \times 10^{-9}$ cm$^2$ or more, preferably, $1 \times 10^{-8}$ cm$^2$, and more preferably, which is composed of a single crystal as a whole. The single crystal thin film 34 may contain a polycrystalline semiconductor region or an amorphous semiconductor region. After the irradiation of excimer laser beams as the second heat-treatment, micro-projections 36 are present on the surface of the single crystal thin film 34. The micro-projection 36 has a height smaller than the height of the micro-projection 35 on the surface of the polycrystalline semiconductor thin film 33. The height of the micro-projection 36 is as very small as a value equal to or less than 5 nm to 20 nm, and the diameter of the micro-projection 36 is as small as 0.1 µm or less. Each of the micro-projections 36 on the surface of the single crystal thin film 34 is formed at a position corresponding to the position at which at least three or more boundaries of the polycrystalline grains obtained by the first heat-treatment are uplifted due to collision thereof. Accordingly, it is apparent that the micro-projections 35 on the surface of the polycrystalline semiconductor thin film 33 are flattened and the remaining projections as uplifted yet become the micro-projections 36 on the surface of the single crystal thin film.

The density of the micro-projections 36 on the surface of the single crystal thin film 34 is also reduced, for example, to $1 \times 10^9$/cm$^2$ or less. The radius of curvature of the micro-projection 36 is larger than the radius of curvature of the micro-projection 35 on the surface of the polycrystalline semiconductor thin film 33, and is generally in a range of 60 nm or more, preferably, 180 nm or more, more preferably, 250 nm or more.

Figure 6:
FIG. 6 is an SEM photograph of the single crystal thin film converted from the polycrystalline semiconductor thin film in the one example of the method of fabricating a single crystal thin film according to the present invention.

FIG. 6 is an SEM photograph of the single crystal thin film 34 converted from the polycrystalline semiconductor thin film 33. From this photograph, it is apparent that the polycrystalline grains developed in a crocodile skin like shape shown in the photograph of FIG. 5 disappear and the plurality of micro-projections also almost disappear, and the single crystal thin film 34 having a large single crystal region is obtained. The size of the single crystal region is about 2 µm, which is large sufficient to form a channel region of a thin film transistor.

In the above description, the single crystal thin film 34 having the micro-projections 36 is formed by the first and second heat-treatments carried out by irradiation of excimer laser beams; however, the present invention is not limited thereto. For example, the first and second heat-treatments may be carried out by irradiation of laser beams emitted from a different kind of laser such as a rare gas laser or a YAG laser, or may be carried out by irradiation of a different kind of energy beams such as X-rays or electron beams on the assumption that the energy beams are not allowed to pass through the thin film. Also since the second heat-treatment is an annealing treatment by heating, such a heat-treatment is not necessarily performed by laser irradiation but may be performed by lamp anneal, relatively long-time furnace anneal, or heating using a strip heater.

The first heat-treatment, which is different from the second heat-treatment performed as the annealing treatment, is preferably performed to form, on an insulating substrate, a polycrystalline thin film in which polycrystalline grains are aligned in an approximately regular pattern in order to form micro-projections. Accordingly, the first heat-treatment is performed by irradiation of excimer laser beams having a large energy. In this case, to obtain polycrystalline grains aligned in an approximately regular pattern, a periodical pattern can be given to the intensities of laser beams by a diffraction phenomenon at opening portions and the like upon irradiation of line beam laser, or a periodical pattern can be given to the intensities of laser beams by an interference or diffraction phenomenon of an intensity modulation mask such as a phase shift mask upon irradiation of rectangular beam laser. The periodical pattern given to the intensities of laser beams exerts an effect on the growth of nuclei of polycrystalline grains, with a result that a polycrystalline thin film in which polycrystalline grains are aligned in an approximately regular pattern is formed on an insulating substrate.

At least either the first heat-treatment or the second heat-treatment can be performed substantially in a vacuum, an inert gas atmosphere, or a non-oxidizing gas atmosphere. In particular, if the treatment is performed by keeping the same atmospheric gas or changing one to another chamber without opening the chamber to atmosphere after an amorphous semiconductor thin film is initially formed on an insulating substrate or between the first and second heat-treatments, it is possible to eliminate a production time wasted for adjustment of the atmospheric gas.

As the insulating substrate 31, there can be various substrates such as a glass substrate having specific rigidity and heat resistance, a so-called white glass, a plastic substrate, a ceramic substrate, a quartz substrate, a silicon wafer, and a substrate obtained by forming an oxide film or a nitride film on a semiconductor wafer. In particular, since the heat-treatment is performed only for a very short time, a substrate having a low heat resistance (for example, 600° C.) can be sufficiently used. In addition, various intermediate layers and a reflection layer, and other functional layers can be provided on the thin film formation surface of the insulating substrate 31.

The single crystal thin film 34 formed on the insulating substrate 31 is a single crystal thin film formed by crystallizing a non-single crystal silicon film such as an amorphous silicon film or a polycrystalline silicon film. The thickness of the single crystal thin film 34 is, for example, set in a range of about 40 nm to 50 nm. The crystallized semiconductor thin film is in the form of a polycrystalline thin film in the state before heat-treatment. In this case, the polycrystalline thin film may be desirable to be in a state that polycrystalline grains are aligned in an approximately regular pattern. In addition to silicon, SiGe and SiC can be used as a material for forming the single crystal thin film 34.

The single crystal thin film 34 may be in a state that a polycrystalline region, a single crystal region in which polycrystalline grains are bonded to each other, and a non-single crystal region are mixed with each other. The size of the single crystal region in which polycrystalline grains are bonded to each other is generally in a range of $1 \times 10^{-9}$ $cm^2$ or more, preferably, $1 \times 10^{-8}$ $cm^2$, more preferably, $16 \times 10^{-8}$ $cm^2$ or more. As the size of a single crystal region in the single crystal thin film becomes larger, the crystal characteristic becomes closer to that of a perfect single crystal, and correspondingly, the performance of the single crystal thin film becomes stable. The single crystal thin film 34 is not required to be formed on the entire surface of the insulating substrate, but may be present in part of the polycrystalline thin film. The single crystal region in the single crystal thin film 34 preferably has either of crystal orientation planes: (110), (111), and (110) planes. The excimer laser is scanned in this embodiment; however, it is not necessarily scanned. Even in this case, polycrystalline grains are aligned in an approximately regular pattern. The first and second heat-treatments are separately performed in this embodiment; however, the first heat-treatment for giving a common boundary condition and the second heat-treatment for converting the polycrystalline film into the single crystal film may be performed nearly simultaneously.

The insulating substrate 31, on which the single crystal thin film 34 has been formed as described above, can be used as a semiconductor substrate for fabricating a semiconductor device. The semiconductor device can be applied as a thin film transistor or another electronic device, particularly, as a thin film transistor for a drive circuit of a liquid crystal display as will be described later. The single crystal thin film formed on the insulating substrate contains a single crystal region which is capable of, when the insulating substrate is used as a semiconductor substrate of a semiconductor device, stabilizing the characteristics of the semiconductor device, and more specifically, which is capable of, when the insulating substrate is used as a semiconductor substrate of a thin film transistor, suppressing a variation in threshold value, and increasing the mobility which allows the device to keep up with high speed operation.

Second Embodiment

Figure 7:
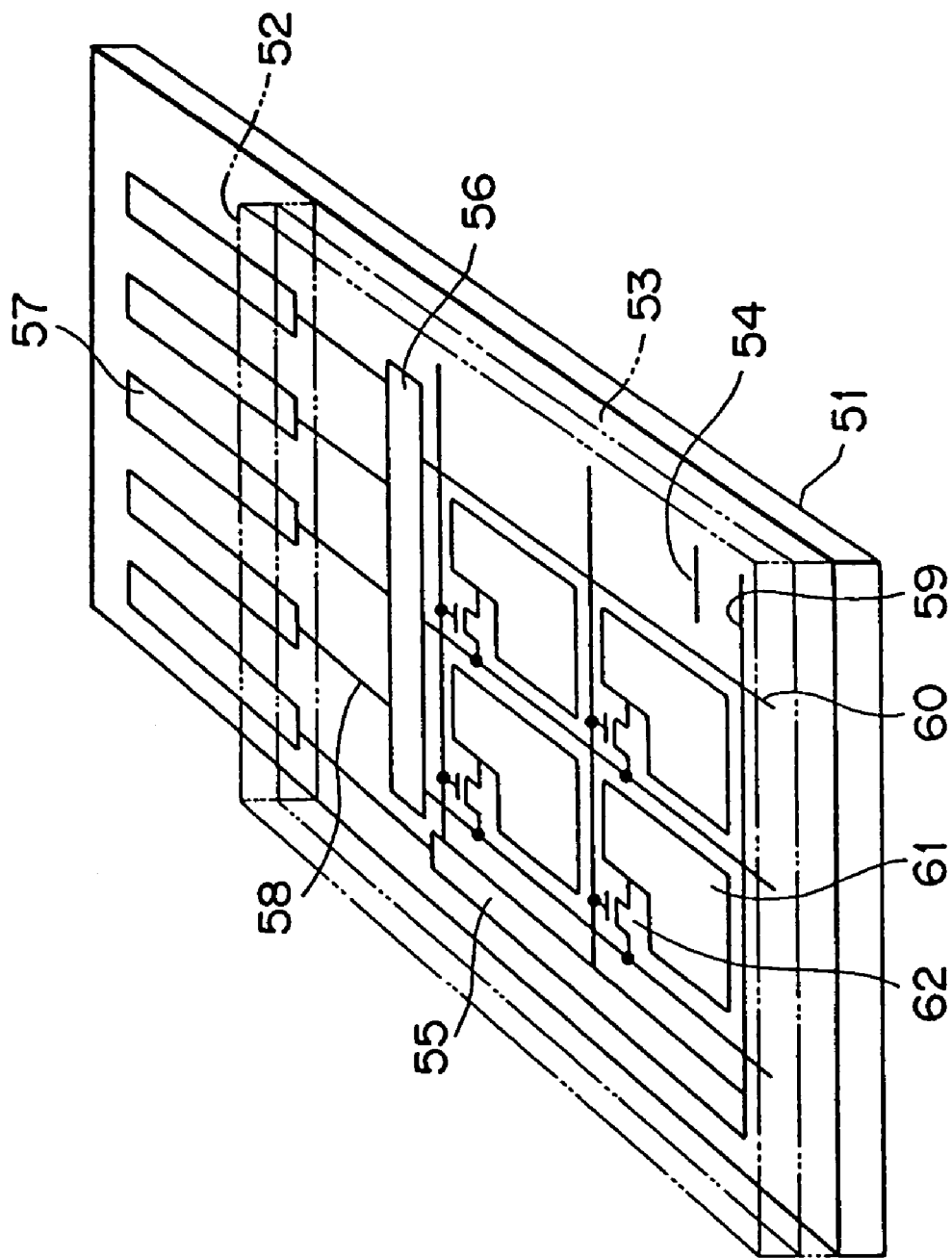
FIG. 7 is a schematic perspective view showing an active matrix type display using a semiconductor device fabricated by using the single crystal thin film of the present invention.

One example of an active matrix type display as a semiconductor device, which uses a thin film transistor fabricated in accordance with the method of fabricating a single crystal thin film according to the present invention, will be described below with reference to FIG. 7. In this embodiment, a semiconductor device is configured by using a thin film having micro-projections as a channel. Referring to FIG. 7, this display has a panel structure including a pair of insulating substrates 51 and 52, and an electro-optical material 53 held therebetween. For example, a liquid crystal material is used as the electro-optical material 53. A pixel array portion 54 and a drive circuit portion are collectively formed on the lower insulating substrate 51. The drive circuit portion is divided into a vertical scanner 55 and a horizontal scanner 56. Terminal portions 57 for external connection are formed at the upper end of a peripheral portion of the insulating substrate 51. The terminal portions 57 are connected to the vertical scanner 55 and the horizontal scanner 56 via wiring lines 58. Gate lines 59 arranged in rows and signal lines 60 arranged in columns are formed in the pixel array portion 54. A pixel electrode 61 and a thin film transistor 62 for driving the pixel electrode 61 are formed at each of intersections between both lines 59 and 60. A gate electrode of the thin film transistor 62 is connected to the corresponding gate line 59. A drain region of the thin film transistor 62 is connected to the corresponding pixel electrode 61, and a source region thereof is connected to the corresponding signal line 60. The gate lines 59 are connected to the vertical scanner 55, and the signal lines 60 are connected to the horizontal scanner 56. Each of the thin film transistors 62 for switchingly driving the pixel electrodes 61 and thin film transistors contained in the vertical scanner 55 and the horizontal scanner 56 is fabricated in accordance with the method described in the first embodiment, such that a channel portion of the thin film has a single crystal region having micro-projections, whose crystal characteristic is closer to that a single crystal. Further, in addition to the vertical scanner and horizontal scanner, a video driver and a timing generator can be also collectively formed in the insulating substrate 51.

Next, third, fourth and fifth embodiments which relate to a semiconductor thin film and a fabrication method thereof, a semiconductor device using the semiconductor thin film as part of the structure, and a substrate according to the present invention, will be described with reference to the drawings.

Third Embodiment

A semiconductor thin film in this embodiment is configured as a semiconductor thin film formed on an insulating base, wherein micro-projections are formed on the surface of the semiconductor thin film.

The semiconductor thin film in this embodiment is also configured as a semiconductor thin film formed, on an insulating base, from a polycrystalline thin film in which polycrystalline grains are aligned in an approximately regular pattern, wherein each micro-projection is formed at a boundary position among at least three or more of the polycrystalline grains.

Figure 8:
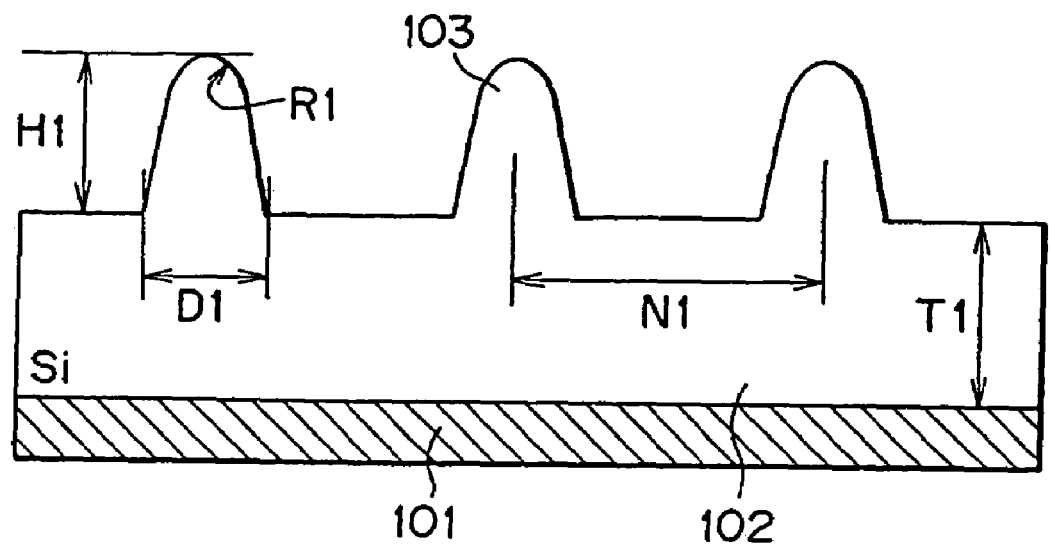
FIG. 8 is a schematic sectional view showing one example of the semiconductor thin film of the present invention.

FIG. 8 is a schematic view of a semiconductor thin film according to the present invention. Referring to FIG. 8, a crystallized thin film 102 is formed on an insulating substrate 101 as an insulating base, and a plurality of micro-projections 103 are formed on the surface of the crystallized thin film 102.

As the insulating substrate 101, there can be various substrates such as a glass substrate having specific rigidity and heat resistance, a so-called white glass, a plastic substrate, a ceramic substrate, a quartz substrate, a silicon wafer, and a substrate obtained by forming an oxide film or a nitride film on a semiconductor wafer. In particular, since heat-treatment is performed only for a very short time in this embodiment, a substrate having a low heat resistance (for example, 600° C.) can be sufficiently used. In addition, various intermediate layers and a reflection layer, and other functional layers can be provided on the thin film formation surface of the insulating substrate 101.

The crystallized thin film 102 formed on the insulating substrate 101 is a semiconductor thin film formed by crystallizing a non-single crystal silicon film such as an amorphous silicon film or a polycrystalline silicon film. A thickness T1 of the crystallized thin film 102 is, for example, set in a range of about 40 nm to 50 nm. The crystallized semiconductor thin film is in the form of a polycrystalline thin film in the state before heat-treatment. In this case, the polycrystalline thin film may be desirable to be in a state that polycrystalline grains are aligned in an approximately regular pattern. The micro-projections 103 are formed on the surface of the crystallized thin film 102.

In the case of forming the semiconductor thin film of the present invention, the micro-projections 103 are formed at the time of heat-treatment. In particular, by performing the first (initial) heat-treatment by using an excimer laser, the micro-projections 103 are formed in an approximately regular pattern on the surface of the crystallized thin film 102. For example, the micro-projections 103 are aligned with a pitch N1 of about 0.3 μm. As viewed from above, the micro-projections 103 are formed on the surface of the crystallized thin film 102 while being aligned in a matrix pattern. The micro-projections 103 are formed into various shapes, for example, approximately conical shapes, rectangular shapes, and deformed shapes. The micro-projections 103 are formed by a manner that the polycrystalline grains are uplifted from the surface due to overlap of crystal boundaries or mutual collision of the polycrystalline grains. As will be described later, in the case of forming the crystallized thin film 102 by irradiation of laser beams emitted from a first excimer laser and irradiation of laser beams emitted from a second excimer laser, since the thin film is formed by an aggregation of polycrystalline grains having approximately rectangular shapes or the like at the time of irradiation of the laser beams emitted from the first excimer laser, the polycrystalline grains are uplifted from the surface at each of four corners of the approximately rectangular shapes and at each boundary position among at least three or more of the polycrystalline grains due to overlap of the crystal boundaries and mutual collision of the polycrystalline grains, so that a plurality of the micro-projections 103 aligned into an approximately regular pattern in the horizontal and vertical directions are formed, particularly, depending on the condition of irradiation of the laser beams emitted from the first excimer laser.

The shape of each micro-projection 103 will be described below with reference to FIG. 8. A height H1 of the micro-projection 103 is defined as a distance between the surface of the crystallized thin film 102 and the top of the micro-projection 103, and is in a range of 20 nm or less, preferably, 10 nm or less, more preferably, 5 nm or less. In particular, at the time of the second heat-treatment, as the crystallization proceeds, the heights H1 of the micro-projections 103 become smaller, so that the surface of the crystallized thin film 102 becomes flat as a whole. A radius of curvature R1 of the micro-projection 103, which tends to become larger as the crystallization proceeds, is in a range of 60 nm or more, preferably, 180 nm or more, more preferably, 250 nm or more. A diameter D1 of the micro-projection 103 is in a range of 0.1 μm or less, preferably, 0.05 μm or less. It is to be noted that since the micro-projection 103 is not necessarily formed into a conical shape, the diameter D1 rather means the size of the micro-projection 103 within the horizontal plane.

Figure 9:
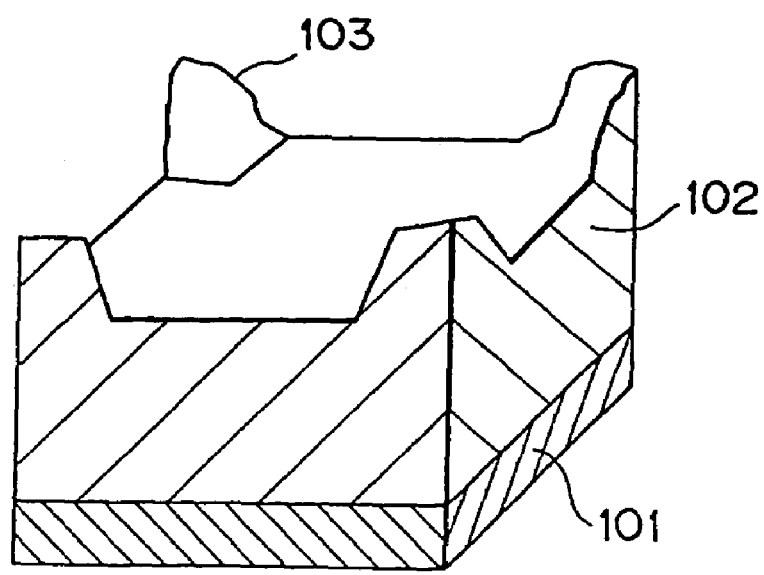
FIG. 9 is a perspective sectional view showing one example of the semiconductor thin film of the present invention.

The alignment pitch N1 of the micro-projections 103 is equivalent to a gap between adjacent two of the micro-projections 103, and more specifically, equivalent to a diameter of each of polycrystalline grains in the state that the micro-projections 103 are present in an aggregation of the polycrystalline grains formed into approximately rectangular shapes. The diameter of each polycrystalline grain is, for example, in a range of 0.1 μm to 4.0 μm. FIG. 9 is a schematic view of the micro-projection 103 located at each of four corners of an approximately rectangular shape. In the example shown in FIG. 9, the pitch N1 of the micro-projection 103 is, for example, set to about 0.3 μm. At this time, the density of the micro-projections 103 is in a range of $1\times10^{10}/cm^2$ or less, preferably, $1\times10^9/cm^2$ or less, more preferably, $5\times10^8/cm^2$ or less. The crystallized thin film 102 may be in a state that a polycrystalline region, a single crystal region in which polycrystalline grains are bonded to each other, and a non-single crystal region are mixed with each other. The size of the single crystal region in which polycrystalline grains are bonded to each other is generally in a range of $1\times10^{-8}$ cm² or more, preferably, $1\times10^{-7}$ cm² or more. As the size of a single crystal region in the crystallized thin film 102 becomes larger, the crystal characteristic becomes closer to that of a perfect single crystal, and correspondingly, the performance of the crystallized thin film 102 becomes stable. The crystallized thin film 102 is not required to be formed on the entire surface of the insulating substrate 101, but may be present in part of the polycrystalline thin film. The single crystal region in the crystallized thin film 102 preferably has either of crystal orientation planes: (110), (111), and (110) planes.

The insulating substrate 101, on which the crystallized thin film 102 has been formed as described above, can be used as a semiconductor substrate for fabricating a semiconductor device. The semiconductor device can be applied as a thin film transistor or another electronic device, particularly, as a thin film transistor for a drive circuit of a liquid crystal display as will be described later. The crystallized thin film 102 formed on the insulating substrate contains a single crystal region which is capable of, when the insulating substrate is used as a semiconductor substrate of a semiconductor device, stabilizing the characteristics of the semiconductor device, and more specifically, which is capable of, when the insulating substrate is used as a semiconductor substrate of a thin film transistor, suppressing a variation in threshold value, and increasing the mobility which allows the device to keep up with high speed operation.

Fourth Embodiment

Next, a fourth embodiment of the present invention, which relates a method of fabricating a semiconductor thin film, will be described with reference to FIGS. 10 to 15. The method of fabricating a semiconductor thin film according to this embodiment includes the step of forming a non-single crystal thin film on an insulating base, the step of subjecting the non-single crystal thin film to a first heat-treatment, thereby forming a polycrystalline thin film, and the step of subjecting the polycrystalline thin film to a second heat-treatment, thereby forming a crystallized semiconductor thin film, wherein projections on the surface of the crystallized semiconductor thin film are smaller than projections on the surface of the polycrystalline thin film.

A modification of the method of fabricating a semiconductor thin film according to this embodiment includes the step of forming a non-single crystal thin film on an insulating base, the step of subjecting the non-single crystal thin film to a first heat-treatment, thereby forming a polycrystalline thin film, and the step of subjecting the polycrystalline thin film to a second heat-treatment, thereby forming a crystallized semiconductor thin film, wherein a radius of curvature of each of projections on the surface of the crystallized semiconductor thin film is larger than a radius of curvature of each of projections on the surface of the polycrystalline thin film.

Another modification of the method of fabricating a semiconductor thin film according to this embodiment includes the step of forming a non-single crystal thin film on an insulating base, the step of subjecting the non-single crystal thin film to a first heat-treatment, thereby forming a polycrystalline thin film in which polycrystalline grains are aligned in an approximately regular pattern, and the step of subjecting the polycrystalline thin film to a second heat-treatment, thereby forming a crystallized semiconductor thin film in which micro-projections are each formed at a boundary position among at least three of more of the polycrystalline grains, wherein the height of each micro-projection is in a range of 25 nm or less and the radius of curvature of each micro-projection is in a range of 60 nm or more.

Figure 10:
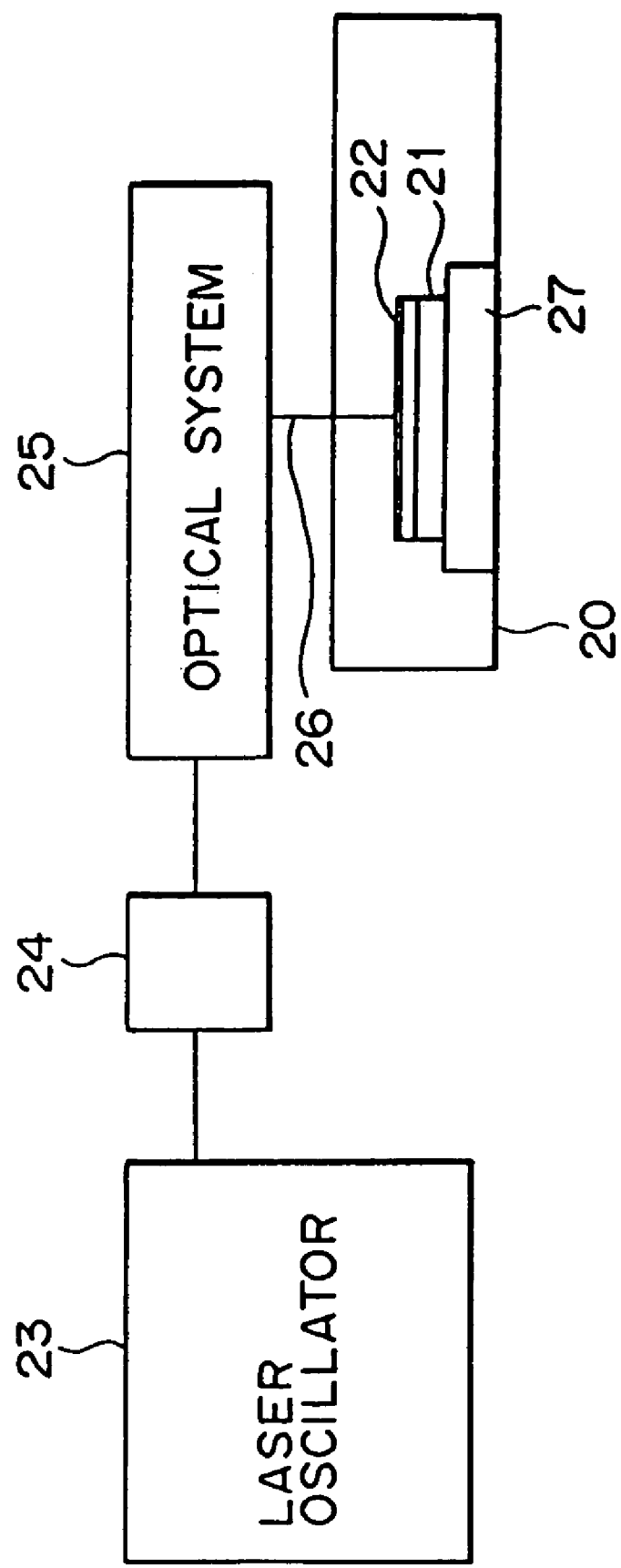
FIG. 10 is a schematic view of an excimer laser irradiation apparatus used for the method of fabricating a semiconductor thin film according to the present invention.

FIG. 10 shows one example of an excimer laser irradiation apparatus used for the method of fabricating a semiconductor thin film according to the present invention. First, there will be described the excimer laser irradiation apparatus used for irradiating a semiconductor thin film 22 formed on an insulating substrate 21 having a low heat resistance such as a glass substrate with excimer laser beams. The insulating substrate 21, on which the semiconductor thin film 22 has been formed, is mounted in a chamber 20. The excimer laser irradiation apparatus has a laser oscillator 23, an attenuator 24, and an optical system 25 including a homogenizer, which components are all arranged outside the chamber 20. A stage 27 movable in the XY directions is provided in the chamber 20. The insulating substrate 21 having the semiconductor thin film 22 formed thereon is mounted on the stage 27.

The excimer laser irradiation apparatus is the same as the excimer laser irradiation described in the first embodiment with reference to FIG. 1, and therefore, the other parts corresponding to those shown in FIG. 1 are designated by the same reference numerals and the overlapped description thereof is omitted.

Figure 11:
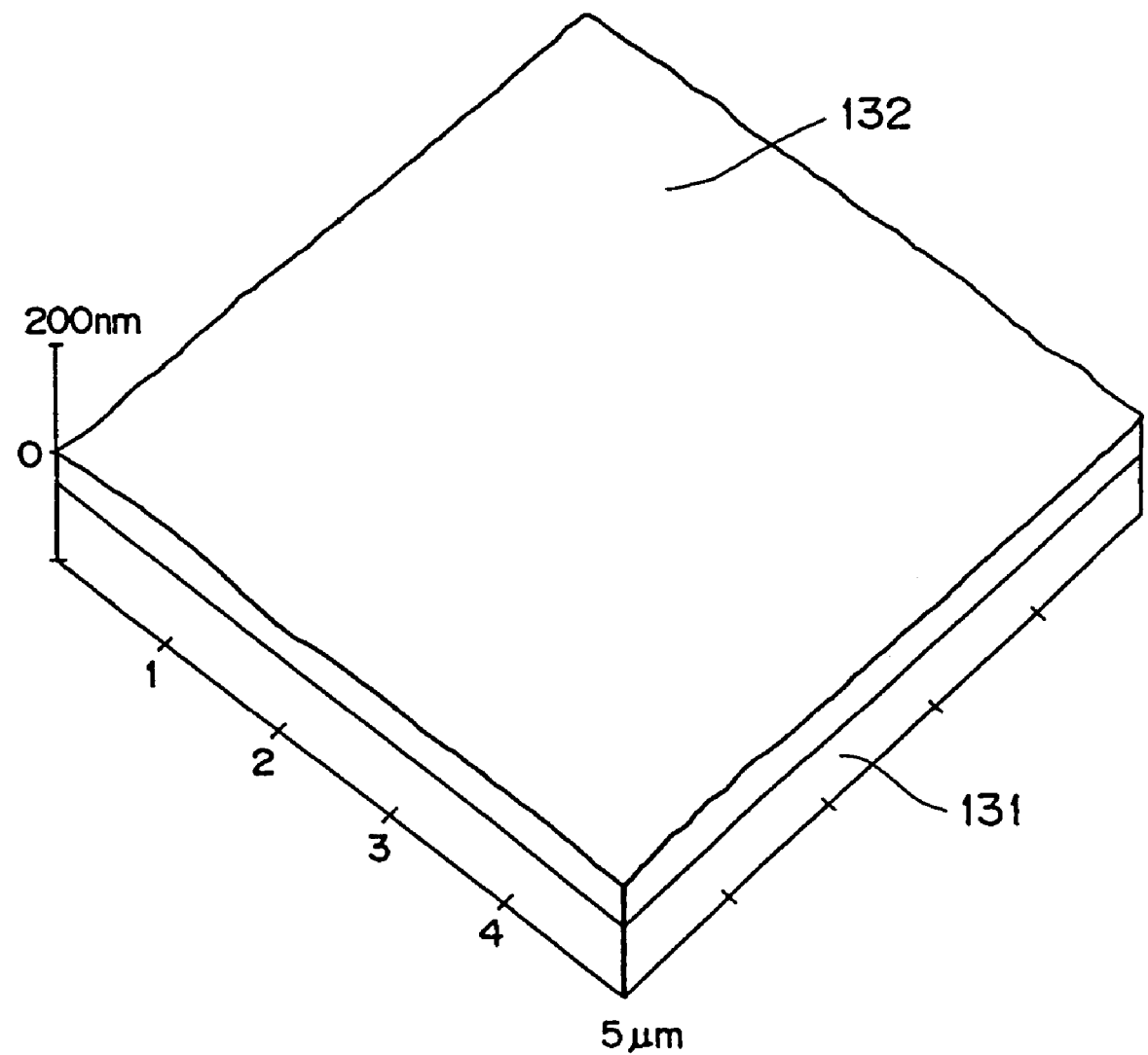
FIG. 11 is a perspective sectional view illustrating a step of forming an amorphous semiconductor thin film in one example of the method of fabricating a semiconductor thin film according to the present invention.

One example of the method of fabricating a semiconductor thin film according to the present invention will be described below with reference to FIGS. 11 to 15. Referring first to FIG. 11, an insulating substrate 131 made from glass, quartz, ceramic, or sapphire is prepared, and an amorphous semiconductor thin film 132 is formed on a principal plane of the insulating substrate 131, for example, by a plasma-enhanced CVD process. As the insulating substrate 131, there may be used a so-called white glass having a low heat resistance because an excimer laser is used as a light source. The thickness of the amorphous semiconductor thin film 132 is typically set to about 50 nm, and may be suitably adjusted in accordance with characteristics of a semiconductor device to be fabricated.

Figure 12:
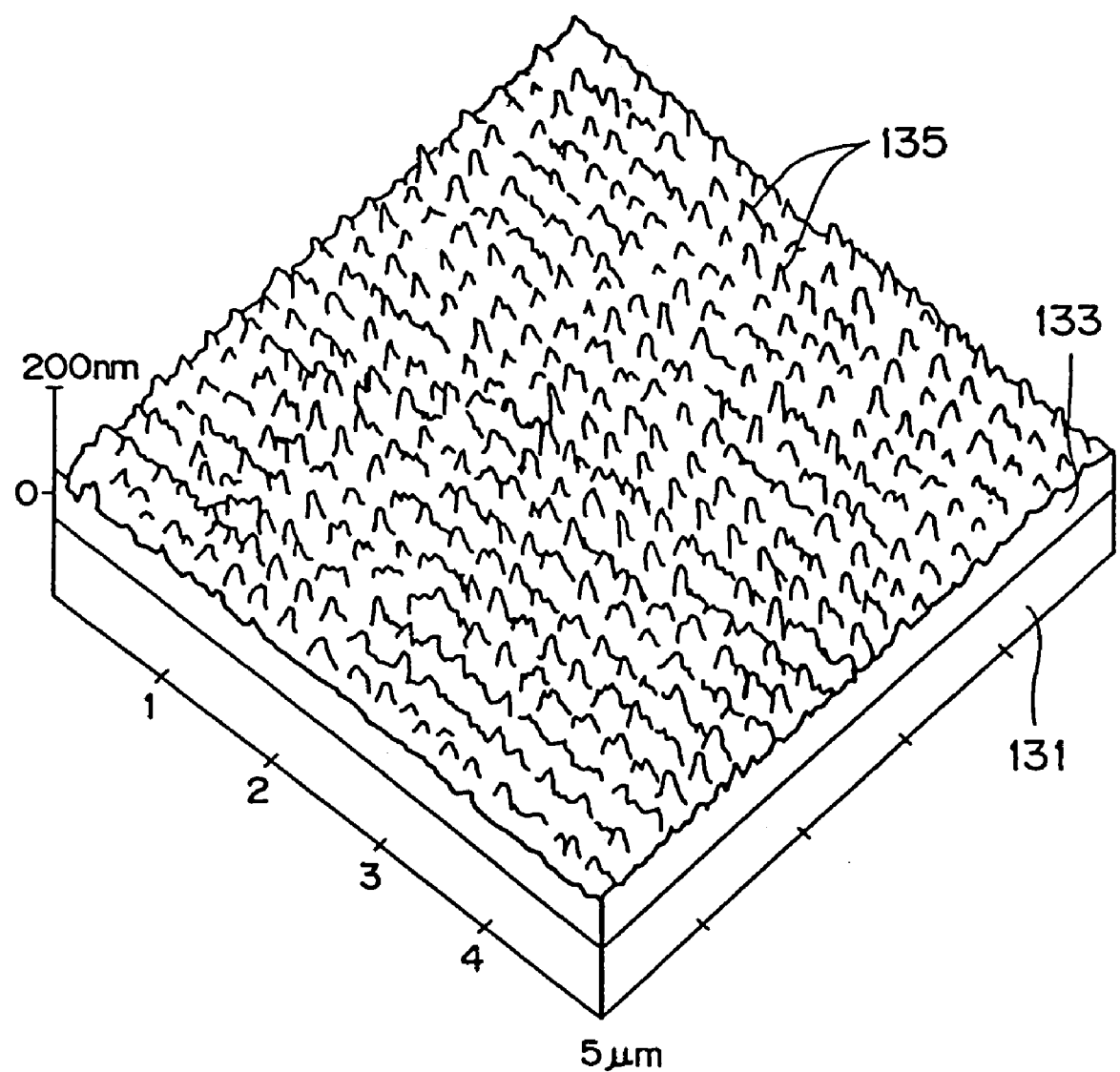
FIG. 12 is a perspective sectional view illustrating a step of forming a polycrystalline semiconductor thin film in the one example of the method of fabricating a semiconductor thin film according to the present invention.

After formation of the amorphous semiconductor thin film 132, the insulating substrate 131, on which the amorphous semiconductor thin film has been formed, is mounted to the excimer laser irradiation apparatus shown in FIG. 10, and is then subjected to irradiation of excimer laser beams as a first heat-treatment. The laser irradiation is performed by using an XeCl excimer laser having a wavelength of 308 nm under conditions that the energy intensity is set to 340 mJ/cm$^2$ and the overlap ratio in the scanning direction is set to 95%. With this laser irradiation, the amorphous semiconductor thin film 132 is melted and recrystallized, to form a polycrystalline semiconductor thin film 133 composed of polycrystalline grains being substantially aligned. Each of the polycrystalline grains in the polycrystalline semiconductor thin film 133 has an approximately rectangular shape whose diagonal line has a length of about 0.2 μm to 0.6 μm. Crystal grain boundaries are also formed by irradiation of excimer laser beams. In a grain boundary portion, as shown in FIG. 12, each micro-projection 135 caused by uplift of crystals due to mutual collision thereof exists at a boundary position among at least three or more polycrystalline grains. The height of the micro-projection 135 is about 50 nm at maximum, and is generally in a range of 25 nm or more.

Figure 14:
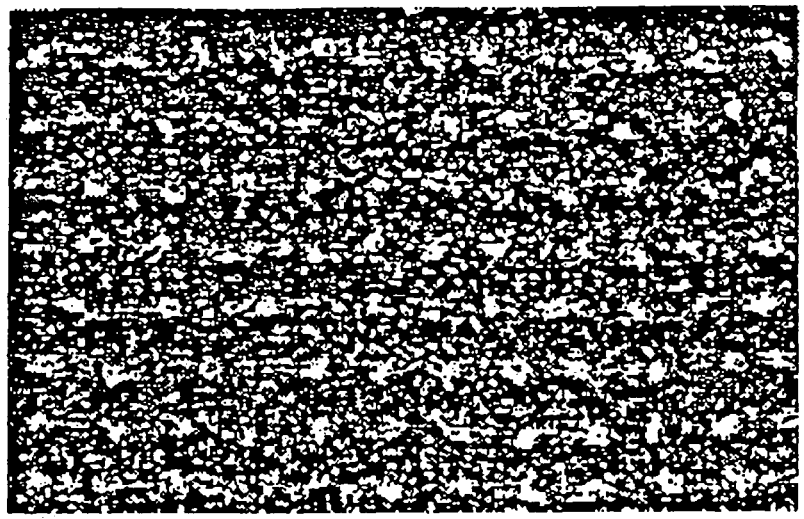
FIG. 14 is an SEM photograph of micro-projections of the polycrystalline semiconductor thin film converted from the amorphous semiconductor thin film in the one example of the method of fabricating a semiconductor thin film according to the present invention.

FIG. 14 is an SEM photograph of the thin film in which the amorphous silicon is converted into polycrystalline silicon. As shown in the photograph, a plurality of micro-projections (which are observed as about 10 pieces of white points within a scale of 3 μm) are arranged. To be more specific, a plurality of polycrystalline grains are aligned in an approximately regular pattern in the horizontal and vertical direction, and the micro-projections are each formed at a boundary position among at least three or more of the polycrystalline grains.

Following the first heat-treatment by laser irradiation, a second heat-treatment is made by irradiation of excimer laser beams. The laser irradiation is performed by using an XeCl excimer laser having a wavelength of 308 nm under conditions that the energy intensity is set to 300 mJ/cm$^2$ and the overlap ratio in the scanning direction is set to 95%. The energy intensity of the excimer laser used for laser irradiation as the second heat-treatment may be lower than the energy intensity of the excimer laser used for laser irradiation as the first heat-treatment, so that the heat-treatment temperature of the polycrystalline semiconductor thin film 133 becomes lower than the heat-treatment temperature at the time of laser irradiation as the first heat-treatment. It should be noted that the heat-treatment temperature of the polycrystalline semiconductor thin film 133 is set to be lower than the melting point of polycrystalline silicon.

The polycrystalline semiconductor thin film 133 is, as shown in FIG. 13, converted into a crystallized semiconductor thin film 134 by irradiation of excimer laser beams as the second heat-treatment. To be more specific, the adjacent polycrystalline grains in the polycrystalline semiconductor thin film 133 formed by the first heat-treatment are bonded to each other by irradiation of excimer laser beams, to form the crystallized semiconductor thin film 134 which includes a single crystal region having a size of at least $1\times10^{-8}$ cm$^2$ or more, and preferably, which is composed of a single crystal as a whole. The heat-treatment temperature of the polycrystalline semiconductor thin film 133 at the time of irradiation of excimer laser beams as the second heat-treatment may be lower than that at the time of irradiation of excimer laser beams as the first heat-treatment, and also may be lower than the melting point of polycrystalline silicon. The crystallized semiconductor thin film 134 may contain a polycrystalline semiconductor region in addition to the single crystal region. After irradiation of excimer laser beams as the second heat-treatment, micro-projections 136 are present on the surface of the crystallized semiconductor thin film 134. The height of each of the micro-projections 136 becomes smaller than the height of each of the micro-projections 135 on the surface of the polycrystalline semiconductor thin film 133, and more specifically, becomes as very small as a value equal to or less than 5 nm to 20 nm. The diameter of the micro-projection 136 becomes as small as 0.1 μm or less. Each of the micro-projections 136 on the surface of the crystallized semiconductor thin film 134 is formed at a position corresponding to the position at which at least three or more boundaries of the polycrystalline grains obtained by the first heat-treatment are uplifted due to collision thereof. Accordingly, it is apparent that the micro-projections 135 on the surface of the polycrystalline semiconductor thin film 133 are flattened and the remaining projections as uplifted yet become the micro-projections 136 on the surface of the crystallized semiconductor thin film 134.

The density of the micro-projections 136 on the surface of the crystallized semiconductor thin film 134 is also reduced, for example, to $1 \times 10^{10}/cm^2$ or less, preferably, $1 \times 10^9/cm^2$ or less. The radius of curvature of the micro-projection 136 is larger than the radius of curvature of the micro-projection 135 on the surface of the polycrystalline semiconductor thin film 133, and is generally in a range of 60 nm or more, preferably, 180 nm or more, more preferably, 250 nm or more.

Figure 15:
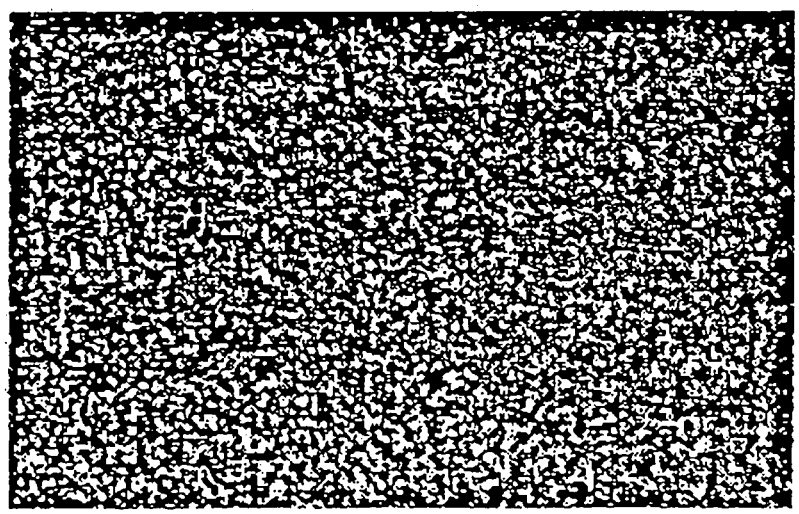
FIG. 15 is an SEM photograph of the micro-projections of the crystallized semiconductor thin film converted from the polycrystalline semiconductor thin film in the one example of the method of fabricating a semiconductor thin film according to the present invention.

FIG. 15 is an SEM photograph of the crystallized semiconductor thin film 134 converted from the polycrystalline semiconductor thin film 133. As shown in this photograph, a plurality of the micro-projections 136 (which are observed as white points) within a scale of 3 μm. The white points shown in FIG. 15 are finely divergent, and are not clear unlike the white points shown in FIG. 14.

In the above description, the crystallized semiconductor thin film 134 having the micro-projections 136 is formed by the first and second heat-treatments carried out by irradiation of excimer laser beams; however, the present invention is not limited thereto. For example, the first and second heat-treatments may be carried out by irradiation of laser beams emitted from a different kind of laser such as a rare gas laser or a YAG laser, or may be carried out by irradiation of a different kind of energy beams such as X-rays or electron beams on the assumption that the energy beams are not allowed to pass through the thin film. Also since the second heat-treatment is an annealing treatment by heating, such a heat-treatment is not necessarily performed by laser irradiation but may be performed by lamp anneal, relatively long-time furnace anneal, or heating using a strip heater.

The first heat-treatment, which is different from the second heat-treatment performed as the annealing treatment, is preferably performed to form, on an insulating substrate, a polycrystalline thin film in which polycrystalline grains are aligned in an approximately regular pattern so as to form micro-projections. Accordingly, the first heat-treatment is performed by irradiation of excimer laser beams having a large energy. In this case, to obtain polycrystalline grains aligned in an approximately regular pattern, a periodical pattern can be given to the intensities of laser beams by a diffraction phenomenon at opening portions and the like upon irradiation of line beam laser, or a periodical pattern can be given to the intensities of laser beams by an interference or diffraction phenomenon of an intensity modulation mask such as a phase shift mask upon irradiation of rectangular beam laser. The periodical pattern given to the intensities of laser beams exerts an effect on the growth of nuclei of polycrystalline grains, with a result that a polycrystalline thin film in which polycrystalline grains are aligned in an approximately regular pattern is formed on an insulating substrate.

At least either the first heat-treatment or the second heat-treatment can be performed substantially in a vacuum, an inert gas atmosphere, or a non-oxidizing gas atmosphere. In particular, if the treatment is performed by keeping the same atmospheric gas or changing one to another chamber without opening the chamber to atmosphere after an amorphous semiconductor thin film is initially formed on an insulating substrate or between the first and second heat-treatments, it is possible to eliminate a production time wasted for adjustment of the atmospheric gas.

Fifth Embodiment

Figure 16:
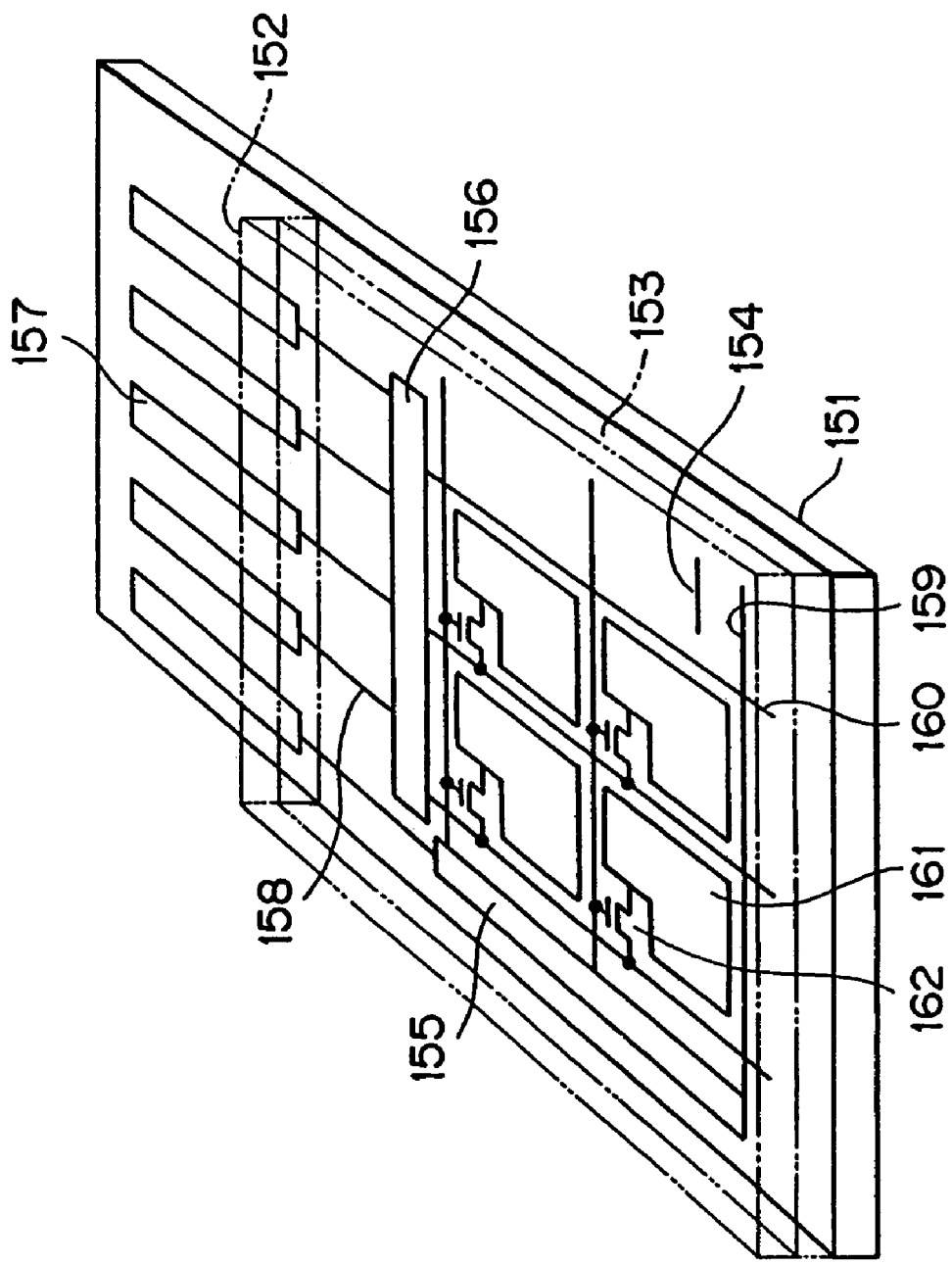
FIG. 16 is a schematic perspective view showing an active matrix type display using a thin film semiconductor device fabricated by using the semiconductor thin film of the present invention.

One example of an active matrix type display as a semiconductor device, which uses a thin film transistor fabricated according to the present invention, will be described below with reference to FIG. 16. In this embodiment, a semiconductor device is configured by using a thin film having micro-projections as a channel. As shown in FIG. 16, this display has a panel structure including a pair of insulating substrates 151 and 152, and an electro-optical material 153 held therebetween. For example, a liquid crystal material is used as the electro-optical material 153. A pixel array portion 154 and a drive circuit portion are collectively formed on the lower insulating substrate 151. The drive circuit portion is divided into a vertical scanner 155 and a horizontal scanner 156. Terminal portions 157 for external connection are formed at the upper end of a peripheral portion of the insulating substrate 151. The terminal portions 157 are connected to the vertical scanner 155 and the horizontal scanner 156 via wiring lines 158. Gate lines 159 arranged in rows and signal lines 160 arranged in columns are formed in the pixel array portion 154. A pixel electrode 161 and a thin film transistor 162 for driving the pixel electrode 161 are formed at each of intersections between both lines 159 and 160. A gate electrode of the thin film transistor 162 is connected to the corresponding gate line 159. A drain region of the thin film transistor 162 is connected to the corresponding pixel electrode 161, and a source region thereof is connected to the corresponding signal line 160. The gate lines 159 are connected to the vertical scanner 155, and the signal lines 160 are connected to the horizontal scanner 156. Each of the thin film transistors 162 for switchingly driving the pixel electrodes 161 and thin film transistors contained in the vertical scanner 155 and the horizontal scanner 156 is fabricated by the method described in the fourth embodiment such that a channel portion of the thin film has a single crystal region having micro-projections, whose crystal characteristic is closer to that a single crystal. Further, in addition to the vertical scanner 155 and horizontal scanner 156, a video driver and a timing generator can be also collectively formed in the insulating substrate 151. Further, a single crystal thin film or a crystal thin film close to a single crystal thin film can be used for the drive circuit portion, and a polycrystalline film or a non-single crystal film can be used for the pixel portion.

Next, sixth, seventh and eighth embodiments, which relate to a method of fabricating a semiconductor thin film and an apparatus for fabricating a single crystal semiconductor thin film usable for the above fabrication method according to the present invention, will be described with reference to the drawings.

One method of fabricating a semiconductor thin film on a base according to the sixth, seventh and eighth embodiments includes the step of forming a hydrogen containing non-single crystal semiconductor thin film, the step of subjecting the hydrogen containing non-single crystal thin film to a first heat-treatment, thereby removing hydrogen, and the step of continuously subjecting the non-single crystal thin film from which hydrogen has been removed to a second heat-treatment, thereby forming a polycrystalline film in which polycrystalline grains are aligned in an approximately regular pattern. Another method of fabricating a semiconductor thin film on a base according to the sixth, seventh and eighth embodiments includes the step of forming a hydrogen containing non-single crystal semiconductor thin film, the step of subjecting the hydrogen containing non-single crystal thin film to a first heat-treatment, thereby removing hydrogen, the step of continuously subjecting the non-single crystal thin film from which hydrogen has been removed to a second heat-treatment, thereby melting and recrystallizing the non-single crystal thin film, and the step of subjecting the melted and recrystallized polycrystalline film to a third heat-treatment, thereby converting the polycrystalline thin film into a single crystal thin film.

Sixth Embodiment

A method of fabricating a semiconductor thin film on a base according to this embodiment includes the step of forming a hydrogen containing non-single crystal semiconductor thin film, the step of subjecting the hydrogen containing non-single crystal thin film to a first heat-treatment, thereby removing hydrogen, and the step of continuously subjecting the non-single crystal thin film from which hydrogen has been removed to a second heat-treatment, thereby forming a polycrystalline film in which polycrystalline grains are aligned in an approximately regular pattern.

Figure 17:
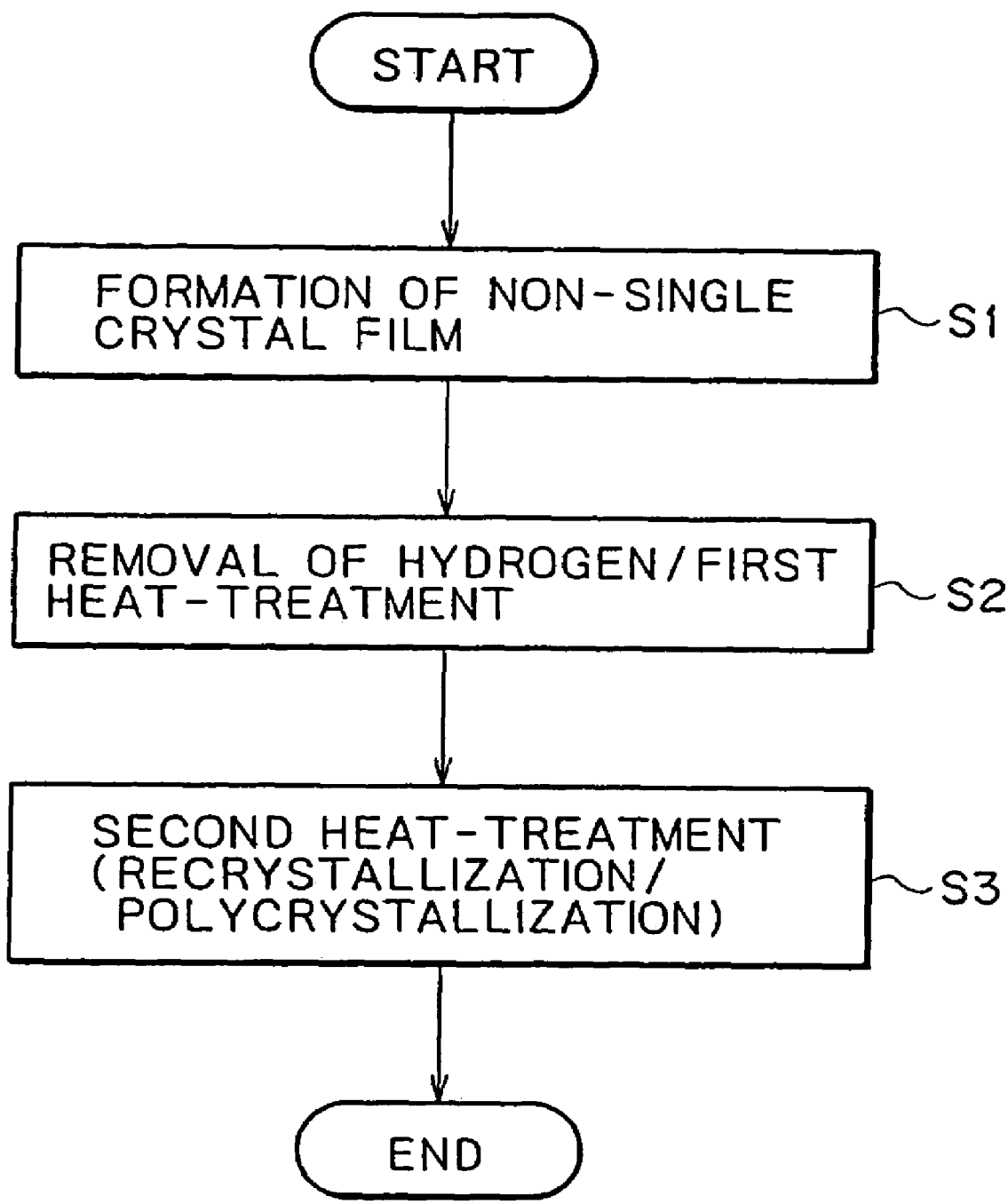
FIG. 17 is a flow chart showing a method of fabricating a semiconductor thin film according to a sixth embodiment of the present invention.

FIG. 17 is a flow chart showing a method of fabricating a semiconductor thin film according to this embodiment. The sequential steps of fabricating a semiconductor thin film according to this embodiment will be described below. In step S1, a non-single crystal film made from amorphous silicon is formed on a base such as an insulating substrate. The formation of such a non-single crystal film is not particularly limited but may be performed by various processes, for example, a plasma CVD process, a low-pressure CVD process, an atmospheric pressure CVD process, a catalyst-assisted CVD process, a photo-assisted CVD process, and a laser CVD process; however, since the step of forming a non-single crystal film is followed by the step of removing hydrogen, the plasma CVD process is preferably used. It is to be noted that the non-single crystal film formed in this step may contain hydrogen.

In step S2, a first heat-treatment for removing hydrogen is performed, for example, by irradiation of excimer laser beams. The laser irradiation can be performed by using an XeCl having a pulse width of 60 nanoseconds or more. With this irradiation of excimer laser beams, hydrogen is removed from the non-single crystal film, so that hydrogen content can be reduced to a level capable of preventing explosion of the film for a short time. As the means for carrying out the first heat-treatment, irradiation of linear or rectangular beam laser emitted from the excimer laser, or irradiation of laser beams emitted from another kind of laser such as a rare gas laser or a YAG laser may be used. However, it may be desirable to use irradiation of laser beams emitted from a laser having a pulse width of 60 nanoseconds, which is allowed to melt the interior of the film but not to melt the substrate.

After the first heat-treatment for removing hydrogen, in step S3, a second heat-treatment is performed by irradiation of excimer laser beams. The laser irradiation is performed by using an XeCl excimer laser having a wavelength of, for example, 308 nm. With this irradiation of excimer laser beams, polycrystalline grains aligned in an approximately regular pattern are formed on the surface of the thin film depending on the irradiation conditions. In other words, the irradiation of excimer laser beams is performed for introducing a common boundary condition to polycrystalline grains, and accordingly, any irradiation means may be used insofar as it can introduce such a common boundary condition to polycrystalline grains. To be more specific, any laser irradiation means, for example, irradiation of line or rectangular beam laser emitted from an excimer laser, or irradiation of laser beams emitted from another kind of laser such as a rare gas laser or a YAG laser, can be used for the second heat-treatment insofar as it can form polycrystalline grains aligned in an approximately regular pattern on the surface of the thin film. In the next step, it may be desirable to further grow in solid-phase the polycrystalline grains aligned in an approximately regular pattern so as to reduce the boundaries of the polycrystalline grains.

The first and second heat-treatments are separately performed in steps S2 and S3; however, they can be continuously performed by using the same chamber, or they can be simultaneously performed by separating or changing regions, to be irradiated with laser beams in the first and second heat-treatments, from each other.

The polycrystalline film formed according to the sixth embodiment is inferior to a single crystal film in terms of both stability of a threshold voltage and mobility; however, the polycrystalline film is advantageous in that since hydrogen is sufficiently removed, the polycrystalline grains are largely grown in solid phase. As a result, if the polycrystalline film is applied to a semiconductor device, it is possible to improve the performance of the semiconductor device. The polycrystalline film has another advantage that since the removal of hydrogen is sufficiently performed for a short time, it is possible to prevent the explosion of the polycrystalline film.

Seventh Embodiment

A method of fabricating a semiconductor thin film on a base according to this embodiment includes the step of forming a hydrogen containing non-single crystal semiconductor thin film, the step of subjecting the hydrogen containing non-single crystal thin film to a first heat-treatment, thereby removing hydrogen, the step of continuously subjecting the non-single crystal thin film from which hydrogen has been removed to a second heat-treatment, thereby melting and recrystallizing the non-single crystal thin film, and the step of subjecting the melted and recrystallized polycrystalline film to a third heat-treatment, thereby converting the polycrystalline thin film into a single crystal thin film.

Figure 18:
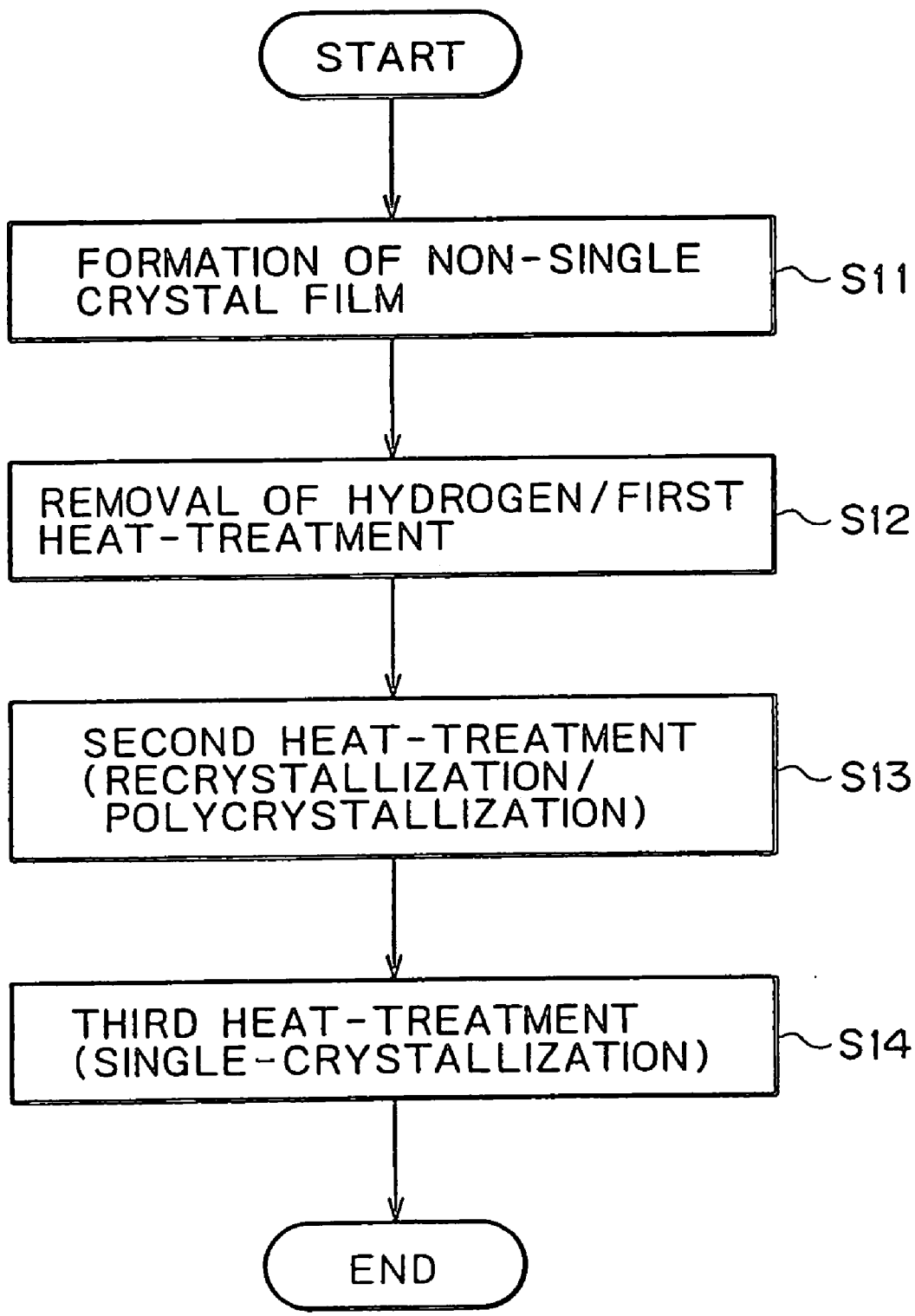
FIG. 18 is a flow chart showing a method of fabricating a semiconductor thin film according to a seventh embodiment of the present invention.

FIG. 18 is a flow chart showing a method of fabricating a semiconductor thin film according to this embodiment. This embodiment is different from the sixth embodiment in that a third heat-treatment is added for converting a polycrystalline film into a single crystal film. The sequential steps of fabricating a semiconductor thin film according to this embodiment will be described below. Like the sixth embodiment, in step S11, a non-single crystal film made from amorphous silicon is formed on a base such as an insulating substrate. The formation of such a non-single crystal film is not particularly limited but may be performed by various processes, for example, a plasma CVD process, a low-pressure CVD process, an atmospheric pressure CVD process, a catalyst-assisted CVD process, a photo-assisted CVD process, and a laser CVD process; however, since the step of forming a non-single crystal film is followed by the step of removing hydrogen, the plasma CVD process is preferably used. It is to be noted that the non-single crystal film formed in this step may contain hydrogen.

In step S12, a first heat-treatment for removing hydrogen is performed, for example, by irradiation of excimer laser beams. The laser irradiation can be performed by using an XeCl having a pulse width of 60 nanoseconds or more. With this irradiation of excimer laser beams, hydrogen is removed from the non-single crystal film, so that hydrogen content can be reduced to a level capable of preventing explosion of the film. As the means for carrying out the first heat-treatment, irradiation of line or rectangular beam laser emitted from the excimer laser, or irradiation of laser beams emitted from another kind of laser such as a rare gas laser or a YAG laser may be used. However, it may be desirable to use irradiation of laser beams emitted from a laser having a pulse width of 60 nanoseconds, which is allowed to melt the interior of the film but not to melt the substrate.

After the first heat-treatment for removing hydrogen, like the sixth embodiment, in step S13, a second heat-treatment is performed by irradiation of excimer laser beams. The laser irradiation is performed by using the same excimer laser that used in the sixth embodiment. With this irradiation of excimer laser beams, polycrystalline grains aligned in an approximately regular pattern are formed on the surface of the thin film depending on the irradiation conditions. In other words, the irradiation of excimer laser beams is performed for introducing a common boundary condition to polycrystalline grains, and accordingly, any irradiation means may be used insofar as it can introduce such a common boundary condition to polycrystalline grains. To be more specific, any laser irradiation means, for example, irradiation of line or rectangular beam laser emitted from an excimer laser, or irradiation of laser beams emitted from another kind of laser such as a rare gas laser or a YAG laser, can be used for the second heat-treatment insofar as it can form polycrystalline grains aligned in an approximately regular pattern on the surface of the thin film.

After the second heat-treatment, in step S14, a third heat-treatment is performed for binding the polycrystalline grains aligned in an approximately regular pattern to each other, to make the boundaries among the polycrystalline grains disappear, thereby forming a single crystal semiconductor thin film. The single crystal semiconductor thin film thus obtained is quite different from a related art film obtained from a polycrystalline film by enlarging sizes of the polycrystalline grains by means of crystallization. That is to say, the single crystal semiconductor thin film according to this embodiment has a crystal quality identical or similar to that of a perfect single crystal, and is, particularly, effectively used as a channel portion of a thin film transistor. Any processing means may be used for carrying out the third heat-treatment insofar as it can convert a polycrystalline film into a single crystal film; however, like the first and second heat-treatments, the irradiation means, for example, irradiation of line or rectangular beam laser, or irradiation of laser beams emitted from a different kind of laser such as a rare gas laser or a YAG laser, may be used.

The first, second, and third heat-treatments are separately performed in steps S12, S13 and S14; however, they can be continuously performed by using the same chamber, or they can be simultaneously performed by separating or changing regions, to be irradiated with laser beams in the first, second and third heat-treatments, from each other.

Figure 19:
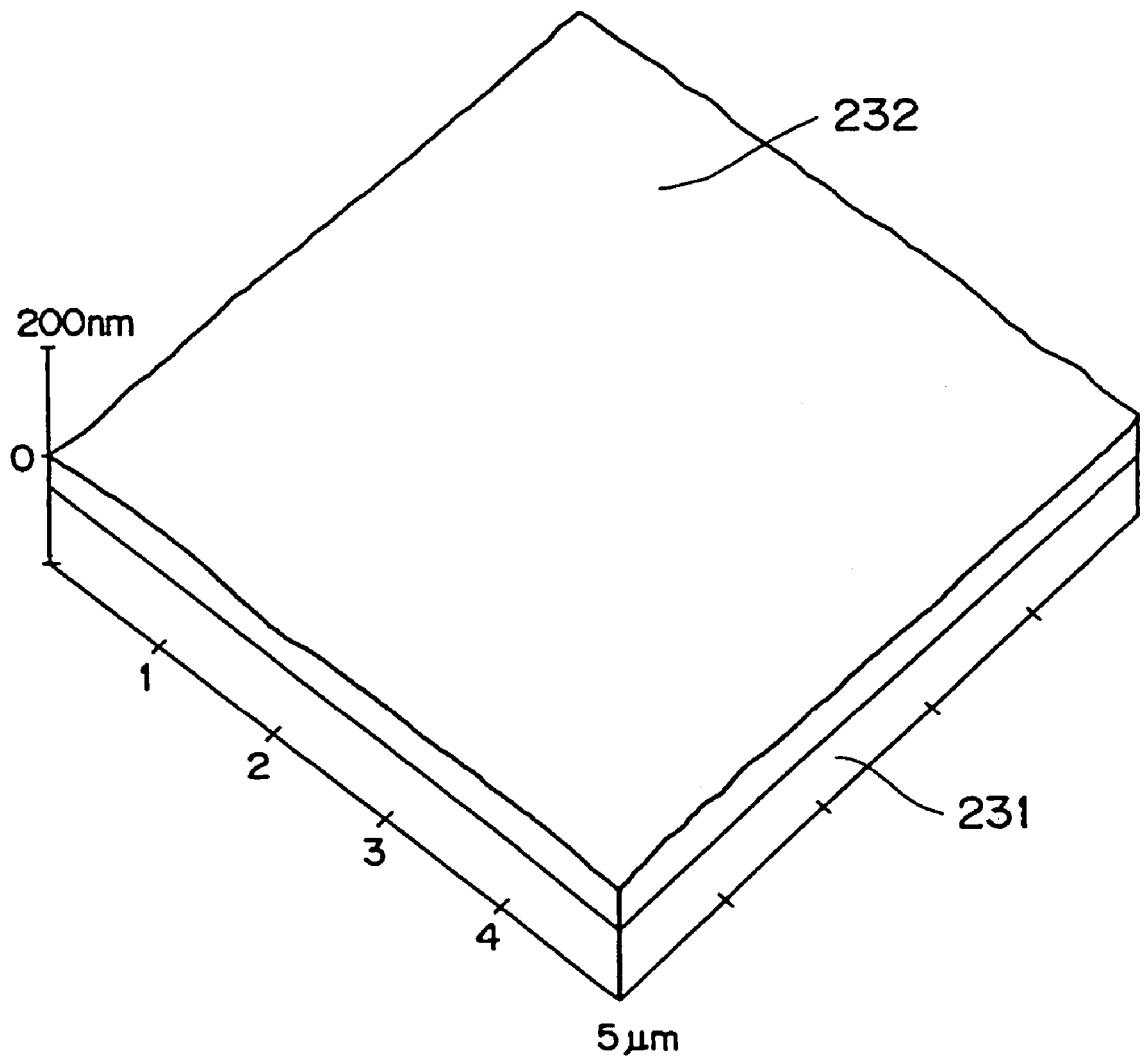
FIG. 19 is a perspective sectional view illustrating a step of forming an amorphous semiconductor thin film in the method of fabricating a semiconductor thin film according to the seventh embodiment of the present invention.

While the method of fabricating a semiconductor thin film according to this embodiment has been described on the basis of the flow chart, it will be more fully described with reference to FIGS. 19 to 23. Referring first to FIG. 19, an insulating substrate 231 made from glass, quartz, ceramic, or sapphire is prepared, and an amorphous semiconductor thin film 232 is formed on a principal plane of the insulating substrate 231, for example, by a plasma-enhanced CVD process. As the insulating substrate 231, there may be used a so-called white glass having a low heat resistance (low melting point) because an excimer laser is used as a light source. As the amorphous semiconductor thin film 232, an amorphous silicon film may be formed, for example, by the plasma-enhanced CVD process. The thickness of the amorphous semiconductor thin film 232, which is typically set to about 50 nm, may be suitably adjusted in accordance with characteristics of a semiconductor device to be fabricated. As one example, the thickness of the amorphous semiconductor thin film 232 may be set in a range of about 100 nm or less, preferably, 80 nm or less, more preferably, 60 nm or less.

After formation of the amorphous semiconductor thin film 232, a portion of the amorphous semiconductor thin film 232 is irradiated with excimer laser beams, to remove hydrogen therefrom. The pulse width of laser beams is set in a range of 60 nanoseconds or more, preferably, 60 to 300 nanoseconds, more preferably, 100 to 250 nanoseconds, most preferably, 120 to 230 nanoseconds. The irradiation of excimer laser beams can be repeated by several shots with an energy intensity of 350 mJ/cm$^2$, and may be repeated by about 50 shots with an energy intensity of 300 mJ/cm$^2$. The irradiation of excimer laser beams with a pulse width of 60 nanoseconds or more makes it possible to remove hydrogen from the amorphous semiconductor thin film 232. Even if the amorphous semiconductor thin film 232 is formed as a thin film containing hydrogen in an amount of 10 atomic % or less, such hydrogen is removed from the thin film by irradiation of excimer laser beams, so that the concentration of a volatile gas in the irradiated region is certainly reduced. For an amorphous silicon film, by suppressing the concentration of hydrogen contained in the film in a range of 8% or less, it is possible to prevent occurrence of abrasion due to hydrogen released from the amorphous silicon film. In the case of converting an amorphous silicon film into a polycrystalline silicon film, it may be desirable to control the hydrogen content in a range of 2 to 5%.

The irradiation of excimer laser beams may be performed by a step & repeat process of moving a stage in a chamber of a degassing apparatus in such a manner as to overlap end portions of beams to each other, thereby intermittently irradiating the surface of a semiconductor thin film with the laser beams in sequence, or performed by scanning a line beam. The excimer laser beam side may be scanned with the stage fixed, or both the stage and the beam side may be moved. In this way, the irradiation of excimer laser beams makes it possible to remove hydrogen from an irradiated region of the thin film, that is, certainly reduce the concentration of hydrogen and the like, and hence to form the amorphous semiconductor thin film 232 containing a hydrogen gas concentration, for example, in a range of less than 2 atomic %.

Figure 20:
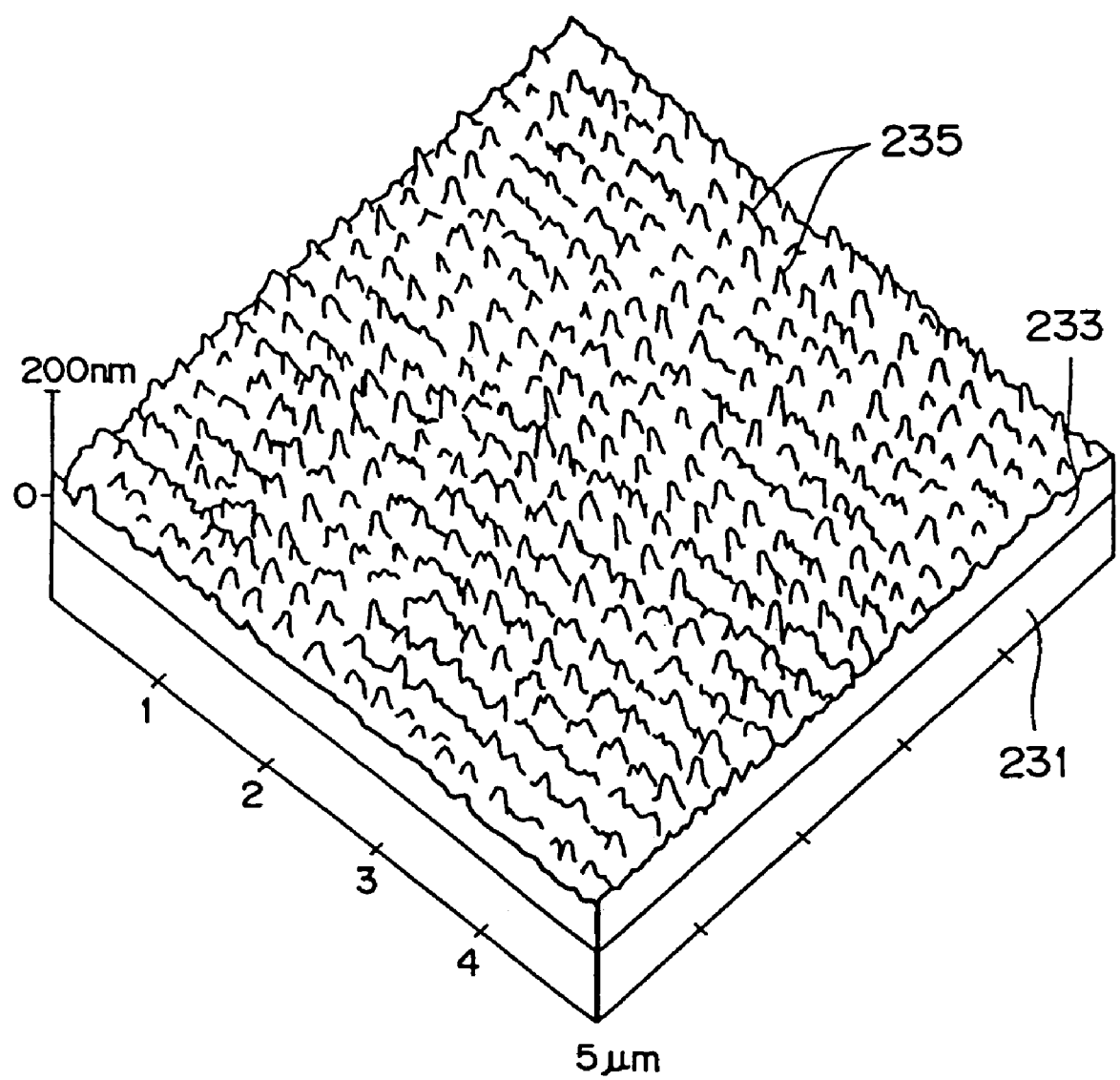
FIG. 20 is a perspective sectional view illustrating a step of forming a polycrystalline semiconductor thin film in the method of fabricating a semiconductor thin film according to the seventh embodiment of the present invention.

The insulating substrate 231, on which the amorphous semiconductor thin film 232 has been formed, is mounted in an excimer laser irradiation apparatus, and is subjected to irradiation of excimer laser beams as a second heat-treatment. The laser irradiation is performed by using an XeCl excimer laser having a wavelength of 308 nm under conditions that the energy intensity is set to 340 mJ/cm² and the overlap ratio in the scanning direction is set to 95%. In addition, the laser irradiation is performed in accordance with a linear laser irradiation process. With this laser irradiation, the amorphous semiconductor thin film 232 is melted and recrystallized, to form a polycrystalline semiconductor thin film 233 composed of polycrystalline grains being substantially aligned as shown in FIG. 20. Each of the polycrystalline grains in the polycrystalline semiconductor thin film 233 has an approximately rectangular shape whose diagonal line has a length of about 0.2 μm to 0.6 μm. Crystal grain boundaries are also formed by irradiation of excimer laser beams. In a grain boundary portion, each micro-projection 235 caused by uplift of crystals due to mutual collision thereof exists at a boundary position among at least three or more of the polycrystalline grains. The height of the micro-projection 235 is about 50 nm at maximum, and is generally in a range of 25 nm or more. The size of each of the polycrystalline grains can be controlled by changing the number of pulses of laser beams. For example, by increasing the number of pulses of laser beams up to 20 shots or more, the size of each of the polycrystalline grains can be increased to 3 μm or more. In addition, the energy intensity selected in this embodiment allows melting and recrystallization of non-single crystal silicon; however, the energy intensity may be selected to a value not to allow melting of polycrystalline silicon. In this case, it is possible to grow polycrystalline silicon in solid-phase.

Figure 22:
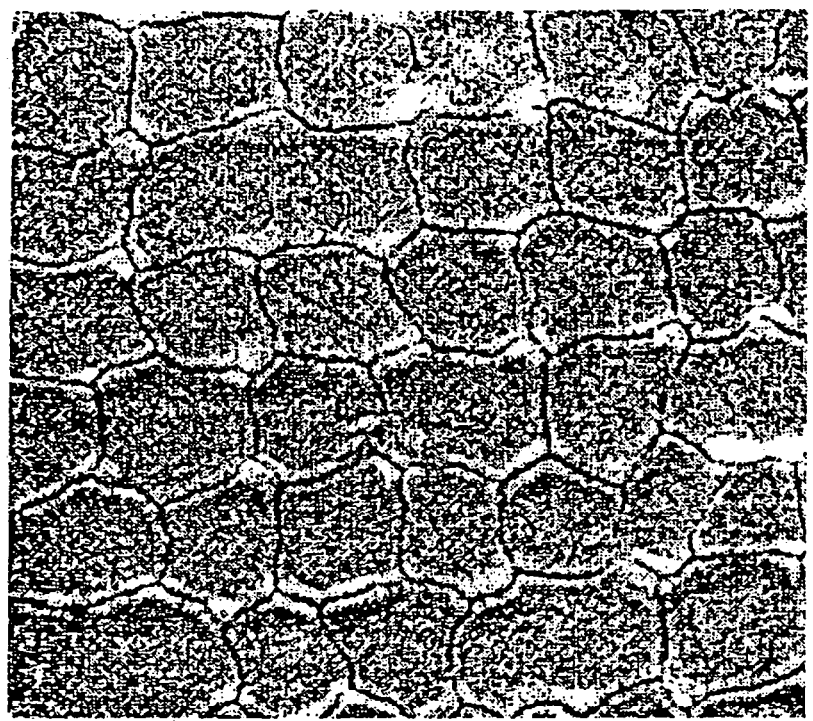
FIG. 22 is an SEM photograph of the polycrystalline semiconductor thin film converted from the amorphous semiconductor thin film in the method of fabricating a semiconductor thin film according to the seventh embodiment of the present invention.

FIG. 22 is an SEM photograph of the polycrystalline semiconductor thin film converted from the amorphous semiconductor thin film by laser irradiation. As shown in this photograph, polycrystalline grains (polysilicon grains) developed in a crocodile skin like shape are aligned in an approximately regular pattern in the horizontal and vertical directions, and a plurality of micro-projections are each formed at a boundary position among at least three or more polycrystalline grains. The alignment of polycrystalline grains in an approximately regular pattern may be considered to occur when a periodical pattern is given to the intensities of laser beams. In the case of irradiation of line beam laser, such a periodical pattern can be given to the intensities of the line beam laser by a diffraction phenomenon at opening portions and the like at the time of irradiation of the line beam laser; and in the case of irradiation of planer laser beams, the periodical pattern can be given to the intensities of the rectangular beam laser by an interference or diffraction phenomenon of an intensity modulation mask such as a phase shift mask at the time of irradiation of the rectangular beam laser. More comprehensively, it may be considered that a common boundary condition be introduced to polycrystalline grains by laser irradiation. In order to largely grow a single crystal region in which polycrystalline grains have been bonded to each other, it may be preferred that adjacent polycrystalline grains be in a state being liable to be bonded to each other. To obtain such a state that adjacent polycrystalline grains are liable to bonded to each other, according to this embodiment, the first heat-treatment is made to form polycrystalline grains aligned in an approximately regular pattern, and thereby to obtain common crystal directivities of the polycrystalline grains, for example, common crystal orientation planes such as the (100) plane at the time of recrystallization after heat-treatment. The polycrystalline grains aligned in the approximately regular pattern after the first heat-treatment will be thus smoothly bonded to each other on the basis of the order thereof. Accordingly, at the next third heat-treatment, the mutual bonding of the polycrystalline grains will be easily promoted, to convert the polycrystalline semiconductor thin film into a single crystal thin film.

Following the second heat-treatment by laser irradiation, a third heat-treatment is made by irradiation of excimer laser beams. The laser irradiation is performed by using an XeCl excimer laser having a wavelength of 308 nm under conditions that the energy intensity is set to 300 mJ/cm² and the overlap ratio in the scanning direction is set to 95%. The energy intensity of the excimer laser used for laser irradiation as the third heat-treatment is lower than the energy intensity of the excimer laser used for laser irradiation as the second heat-treatment, so that the heat-treatment temperature of the polycrystalline semiconductor thin film 233 becomes lower than the heat-treatment temperature at the time of laser irradiation as the second heat-treatment. It may be considered that, by performing the annealing treatment at such a lower temperature, polycrystalline silicon once formed be grown in solid phase and thereby the adjacent polycrystalline grains be bonded to each other. This heat-treatment temperature is set to be lower than the melting point of polycrystalline silicon which is the material forming the polycrystalline semiconductor thin film 233. Further, an integral irradiation energy amount (pulse energy×pulse number) at the third heat-treatment is set to be larger than that at the second heat-treatment in order to effectively convert the polycrystalline semiconductor thin film into a single crystal thin film.

Figure 21:
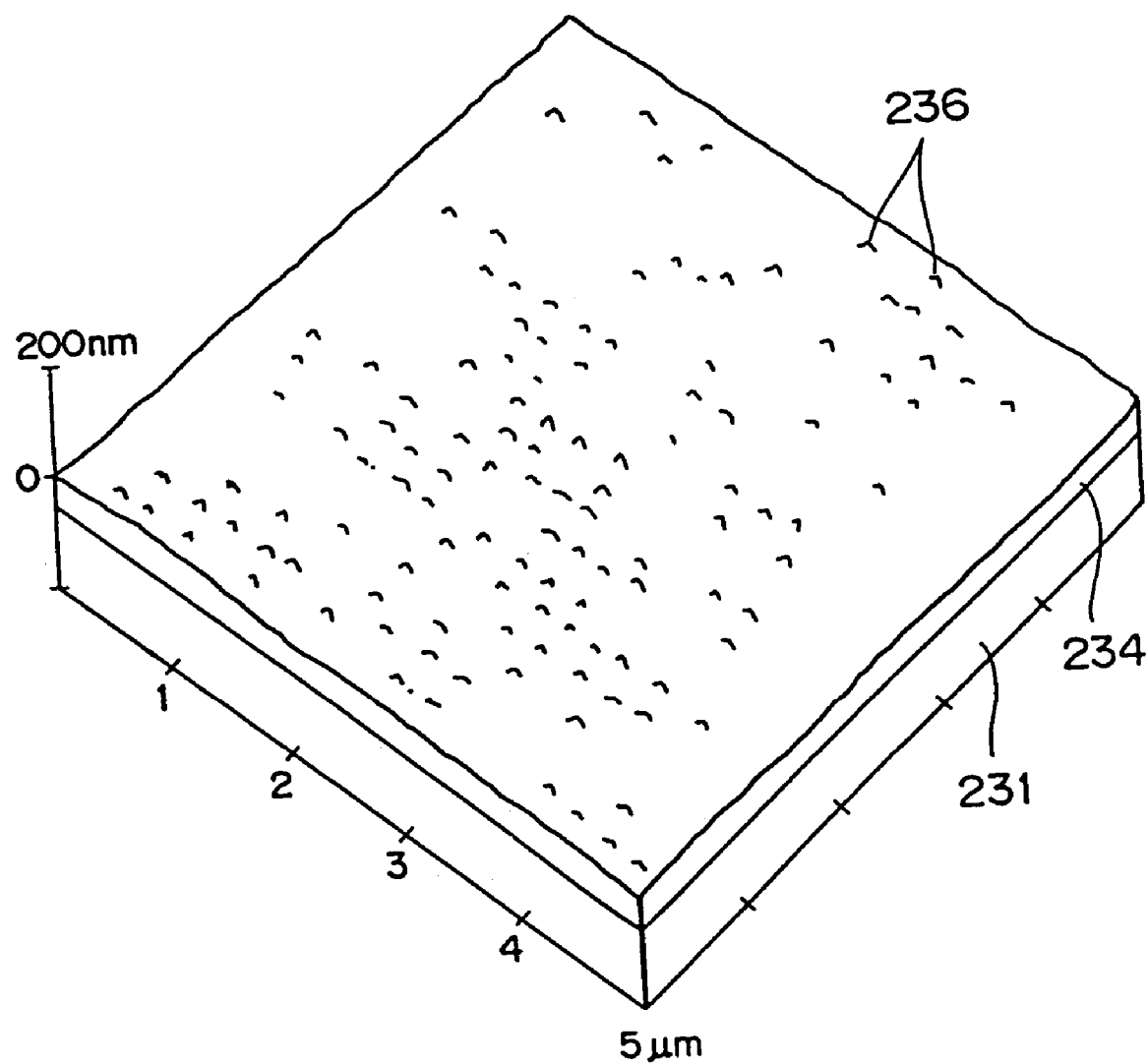
FIG. 21 is a perspective sectional view illustrating a step of forming a single crystal thin film in the method of fabricating a semiconductor thin film according to the seventh embodiment of the present invention.

The polycrystalline semiconductor thin film 233 is, as shown in FIG. 21, converted into a single crystal thin film 234 by irradiation of excimer laser beams as the third heat-treatment. To be more specific, the adjacent polycrystalline grains in the polycrystalline semiconductor thin film 233 formed by the second heat-treatment are bonded to each other by irradiation of excimer laser beams, to form the single crystal thin film 234 which includes a single crystal region having a size of at least $9 \times 10^{-8}$ cm² or more, and preferably, which is composed of a single crystal as a whole. The single crystal thin film 234 may contain a polycrystalline semiconductor region or an amorphous semiconductor region.

After the irradiation of excimer laser beams as the third heat-treatment, micro-projections 236 are present on the surface of the single crystal thin film 234. The micro-projection 236 has a height smaller than the height of the micro-projection 235 on the surface of the polycrystalline semiconductor thin film 233. The height of the micro-projection 236 is as very small as a value equal to or less than 5 nm to 20 nm. The diameter of the micro-projection 236 is as small as 0.1 μm or less. The density of the micro-projections 236 is in a range of $1 \times 10^{-4}$ piece/cm² or less. Each of the micro-projections 236 on the surface of the single crystal thin film 234 is formed at a position corresponding to the position at which at least three or more boundaries of the polycrystalline grains obtained by the second heat-treatment are uplifted due to collision thereof. That is to say, the micro-projections 235 on the surface of the polycrystalline semiconductor thin film 233 are flattened and the remaining projections as uplifted yet become the micro-projections 236 on the surface of the single crystal thin film 234. Some micro-projections 235 perfectly disappear.

Figure 23:
FIG. 23 is an SEM photograph of the single crystal thin film converted from the polycrystalline semiconductor thin film in the method of fabricating a semiconductor thin film according to the seventh embodiment of the present invention.

FIG. 23 is an SEM photograph of the single crystal thin film 234 converted from the polycrystalline semiconductor thin film 233. From this photograph, it is apparent that the polycrystalline grains developed in a crocodile skin like shape shown in the photograph of FIG. 22 disappear and the plurality of micro-projections also almost disappear, and the single crystal thin film 234 having a large single crystal region is obtained. The size of the single crystal region is about 2 μm, which is large sufficient to form a channel region of a thin film transistor.

As described above, the single crystal thin film 234 having the micro-projections 236 is formed by the second and third heat-treatments carried out by irradiation of excimer laser beams; however, the present invention is not limited thereto. For example, the second and third heat-treatments may be carried out by irradiation of laser beams emitted from a different kind of laser such as a rare gas laser or a YAG laser, or may be carried out by irradiation of a different kind of energy beams such as X-rays or electron beams on the assumption that the energy beams are not allowed to pass through the thin film. Also since the third heat-treatment is an annealing treatment by heating, such a heat-treatment is not necessarily performed by laser irradiation but may be performed by lamp anneal, relatively long-time furnace anneal, or carbon heater anneal using a strip heater. In the case of performing the third heat-treatment by furnace anneal, it may be desirable that quartz having a heat resistance be used as the substrate and the heat-treatment be performed at a temperature of 400 to 1000° C. for 30 min or more. Even in the case of performing the third heat-treatment by lamp anneal, it may be desirable that quartz having a heat resistance be used as the substrate and the heat-treatment be performed at a temperature of 400 to 1000° C.

The second heat-treatment, which is different from the third heat-treatment performed as the annealing treatment, is preferably performed to form, on an insulating substrate, a polycrystalline thin film in which polycrystalline grains are aligned in an approximately regular pattern. Accordingly, the second heat-treatment is performed by irradiation of excimer laser beams having a large energy. In this case, to obtain polycrystalline grains aligned in an approximately regular pattern, a periodical pattern can be given to the intensities of laser beams by a diffraction phenomenon at opening portions and the like upon irradiation of line beam laser, or a periodical pattern can be given to the intensities of laser beams by an interference or diffraction phenomenon of an intensity modulation mask such as a phase shift mask upon irradiation of rectangular beam laser. The periodical pattern given to the intensities of laser beams exerts an effect on the growth of nuclei of polycrystalline grains, with a result that a polycrystalline thin film in which polycrystalline grains are aligned in an approximately regular pattern is formed on an insulating substrate.

At least either of the first, second and third heat-treatments can be performed substantially in a vacuum, an inert gas atmosphere, or a non-oxidizing gas atmosphere. In particular, if the treatment is performed by keeping the same atmospheric gas or changing one to another chamber without opening the chamber to atmosphere after an amorphous semiconductor thin film is initially formed on an insulating substrate, between the first and second heat-treatments, or between the second and third heat-treatments, it is possible to eliminate a production time wasted for adjustment of the atmospheric gas. Since the chamber is not opened to atmosphere, it is possible to eliminate the effect of oxidation.

As the insulating substrate 231, there can be various substrates such as a glass substrate having specific rigidity and heat resistance, a so-called white glass, a plastic substrate, a ceramic substrate, a quartz substrate, a silicon wafer, and a substrate obtained by forming an oxide film or a nitride film on a semiconductor wafer. In particular, since the heat-treatment is performed only for a very short time, a substrate having a low heat resistance (for example, 600° C.) can be sufficiently used. In addition, various intermediate layers and a reflection layer, and other functional layers can be provided on the thin film formation surface of the insulating substrate 231.

The single crystal thin film 234 formed on the insulating substrate 231 is a single crystal thin film formed by crystallizing a non-single crystal silicon film such as an amorphous silicon film or a polycrystalline silicon film. The thickness of the single crystal thin film 234 is, for example, set in a range of about 40 nm to 50 nm. The crystallized semiconductor thin film is in the form of a polycrystalline thin film in the state before heat-treatment. In this case, the polycrystalline thin film may be desirable to be in a state that polycrystalline grains are aligned in an approximately regular pattern. In addition to silicon, SiGe and SiC can be used as a material for forming the single crystal thin film 234.

The single crystal thin film 234 may be in a state that a polycrystalline region, a single crystal region in which polycrystalline grains are bonded to each other, and a non-single crystal region are mixed with each other. The size of the single crystal region in which polycrystalline grains are bonded to each other is generally in a range of $9 \times 10^{-1}$ cm$^2$ or more, preferably, $16 \times 10^{-8}$ cm$^2$ or more. As the size of a single crystal region in the single crystal thin film becomes larger, the crystal characteristic becomes closer to that of a perfect single crystal, and correspondingly, the performance of the single crystal thin film becomes stable. The single crystal thin film 234 is not required to be formed on the entire surface of the insulating substrate, but may be present in part of the polycrystalline thin film. The single crystal region in the single crystal thin film 234 preferably has either of crystal orientation planes: (100), (111), and (110) planes. The major crystal orientation plane is the (100) plane, but the crystal orientation planes (111) and (110) are also present.

The insulating substrate 231, on which the single crystal thin film 234 has been formed as described above, can be used as a semiconductor substrate for fabricating a semiconductor device. The semiconductor device can be applied as a thin film transistor or another electronic device, particularly, as a thin film transistor for a drive circuit of a liquid crystal display as will be described later. The single crystal thin film formed on the insulating substrate contains a single crystal region which is capable of, when the insulating substrate is used as a semiconductor substrate of a semiconductor device, stabilizing the characteristics of the semiconductor device, and more specifically, which is capable of, when the insulating substrate is used as a semiconductor substrate of a thin film transistor, suppressing a variation in threshold value, and increasing the mobility which allows the device to keep up with high speed operation.

Eighth Embodiment

An eighth embodiment of the present invention, which relates to an apparatus for fabricating a single crystal semiconductor thin film, will be described with reference to FIG. 24 and FIGS. 25A to 25F.

Figure 24:
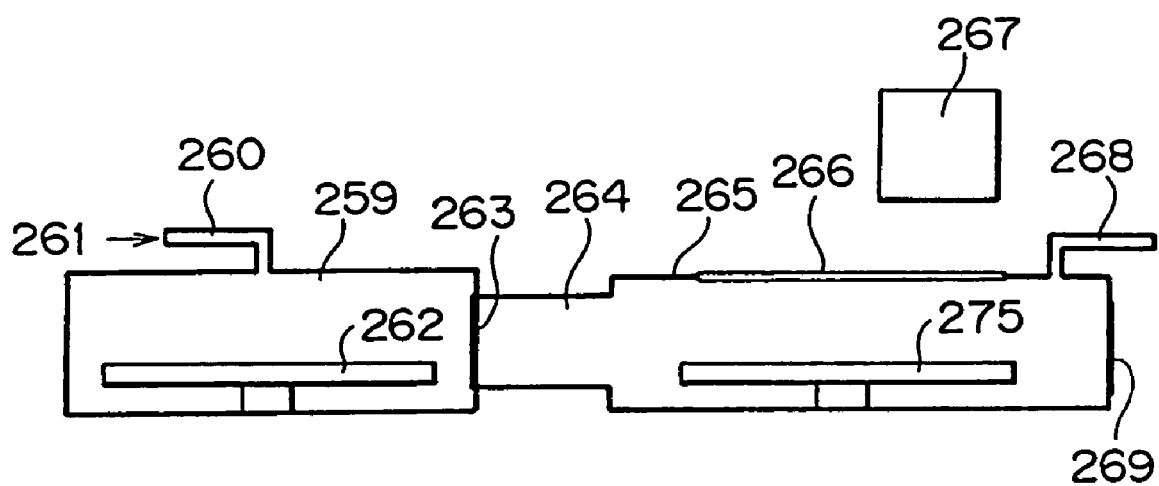
FIG. 24 is a schematic view showing a structure of an apparatus for fabricating a single crystal semiconductor thin film according to an eighth embodiment of the present invention.

First, an apparatus for fabricating a single crystal semiconductor thin film will be described with reference to FIG. 24. FIG. 24 is a schematic sectional view showing one example of the apparatus for fabricating a semiconductor thin film in this embodiment. The fabrication apparatus basically includes a CVD chamber 259, a laser irradiation chamber 265, and a carrying chamber 264 for connecting both the chambers 259 and 265 to each other.

The CVD chamber 259 is a processing chamber for forming a thin film on a substrate mounted on a sample stage 262 by a CVD process. A film forming gas 261 is introduced from a gas inlet 260 formed in an upper portion of the CVD chamber 259, to form the thin film on the substrate. The carrying chamber 264 forms a carrying path through which the substrate having been processed in the CVD chamber 259 is carried to the laser irradiation chamber 265 without opening the chambers to atmosphere. In particular, a gate 263 is provided between the CVD chamber 259 and the carrying chamber 264. For example, during a period in which the thin film is being formed by the CVD process, the gate 263 is kept closed to prohibit communication of the gas between the CVD chamber 259 and the carrying chamber 264. The laser irradiation chamber 265 is a processing chamber for performing a degassing treatment by laser irradiation and an annealing treatment for recrystallization. The laser irradiation chamber 265 has a sample stage 275 on which the substrate having been carried from the carrying chamber 264 is mounted. A quartz window 266 allowing laser beams to pass therethrough is provided in an upper portion of the laser irradiation chamber 265. Laser beams emitted from an excimer laser 267 travel through the quartz window 266, to irradiate the upper surface of the substrate in the laser irradiation chamber 265. A gas inlet 268 for changing the atmosphere in the laser irradiation chamber 265 into a specific atmosphere such as a nitrogen atmosphere is provided in an upper portion of the laser irradiation chamber 265. A discharge port 269 for discharging the substrate having been processed by laser irradiation is provided in a rear wall of the laser irradiation chamber 265.

The excimer laser 267 disposed over the laser irradiation chamber 265 is a laser having a pulse width of 60 nanoseconds or more. In this embodiment, the removal of hydrogen and recrystallization by annealing are performed by changing the energy density of irradiation of excimer laser beams. The excimer laser 267 is initially located at a position facing to an end portion of the substrate on the sample stage 275 for irradiating the end portion and is horizontally moved therefrom.

A method of fabricating a semiconductor thin film, which includes the steps of performing degassing and crystallization by using the apparatus for fabricating a semiconductor thin film shown in FIG. 24, will be described with reference to FIGS. 25A to 25F.

Figure 25A:
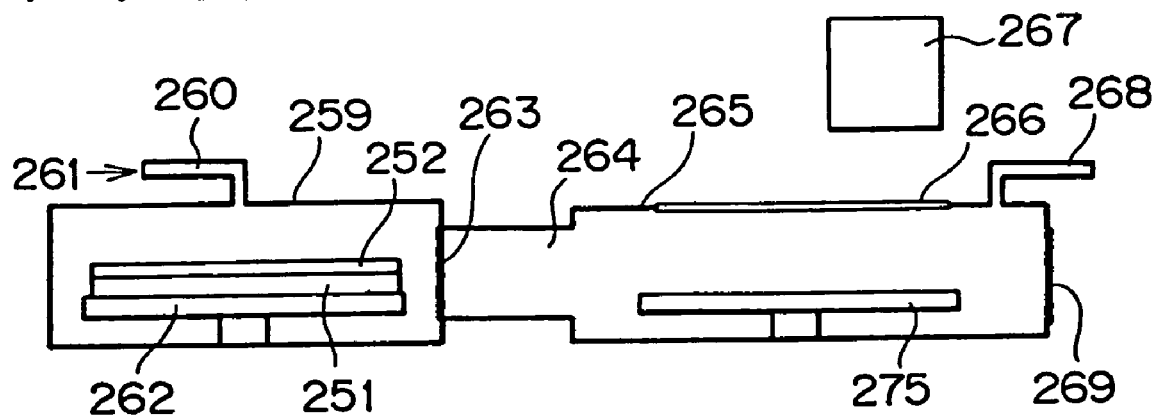
Figure 25B:
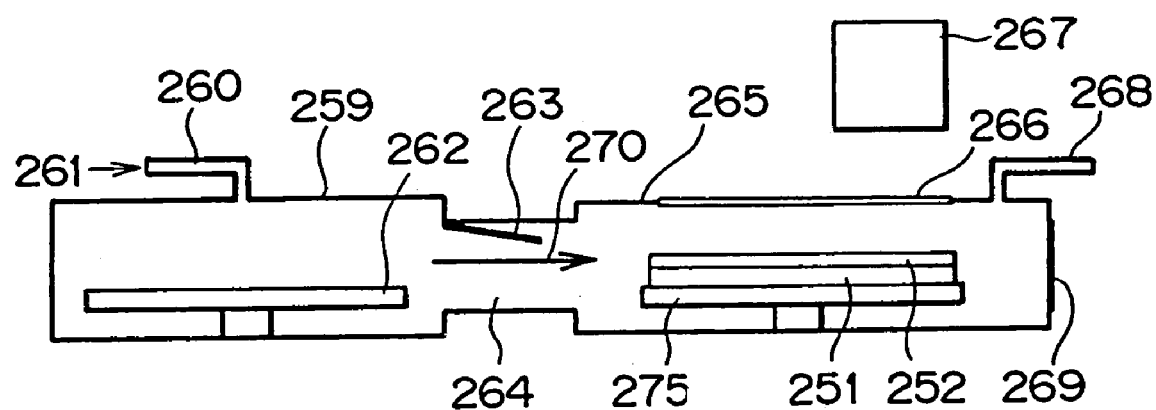

Referring first to FIG. 25A, a substrate 251 is mounted on the sample stage 262 in the CVD chamber 259, and the gate 263 is closed to perform film formation by a CVD process. The film formation by CVD is performed as follows: namely, silane and hydrogen gas, which are taken as CVD gases for forming an amorphous silicon film, are introduced in the CVD chamber 259 through the gas inlet 260, and simultaneously plasma discharge is performed in the CVD chamber 259, whereby an amorphous silicon (a-Si) film 252 is deposited on the substrate 251. In the case of forming the amorphous silicon film 252 by such a plasma-enhanced CVD, hydrogen is necessarily contained in the amorphous silicon film 252.

After film formation, the plasma discharge is stopped and the supply of the CVD gases is stopped, and the interior of the CVD chamber 259 is evacuated. After evacuation of the interior of the CVD chamber 259, both the carrying chamber 264 and the laser irradiation chamber 265 are also evacuated. The gate 263 is then opened, and the substrate 251 on which the film has been formed in the CVD chamber 259 is carried in the direction 270 shown in FIG. 25B. The substrate 251 passes through the carrying chamber 264 and reaches the laser irradiation chamber 265. In the laser irradiation chamber 265, the substrate 251 on which the film has been formed is mounted on the sample stage 275. The gate 263 formed between the carrying chamber 264 and the CVD chamber 259 is closed after the substrate 251 passes through the gate 263. With this configuration, since the atmosphere around the substrate 251 is not opened to atmosphere during a period in which the substrate 251 is carried from the CVD chamber 259 to the laser irradiation chamber 265, it is possible to process the substrate 251 for a short time and to reduce the possibility that the substrate 251 is contaminated with unnecessary impurities.

Figure 25C:
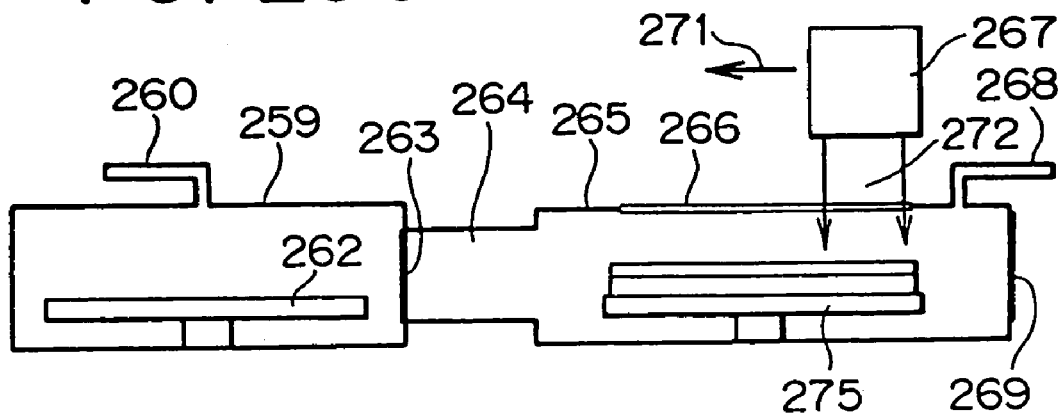

After the substrate 251 on which the amorphous silicon film 252 containing hydrogen has been formed is mounted on the sample stage 275 in the laser irradiation chamber 265, the amorphous silicon film 252 is, as shown in FIG. 25C, irradiated with laser beams 272 for removing hydrogen. The irradiation of the laser beams 272 is performed by using the excimer laser 267 (pulse width: 60 nanoseconds or more). The energy density of the laser beams 272 is set to a value not allowed to melt and crystallize the amorphous silicon film 252, for example, about 300 mJ/cm$^2$. Since the laser beam 272 emitted from the excimer laser 267 is not impinged on the entire surface of the amorphous silicon film 252 on the substrate 251 at once, the excimer laser 267 is moved in the direction 271 in the figure along the principal plane of the substrate 251 to perform degassing over the entire surface of the amorphous silicon film 252 containing hydrogen. In addition, there may be adopted another configuration that the size of the laser irradiation chamber 265 is made as large as twice the size of the substrate 251 and the sample stage 275 is configured as an XY-stage, wherein the sample stage 275 is moved within the horizontal plane with the excimer laser 267 fixed to irradiate the entire surface of the amorphous silicon film 252 with the laser beams 272 emitted from the excimer laser 267. In addition, both the laser beams 272 of the excimer laser 267 and sample stage 275 can be moved. With such irradiation of the laser beams 272 for degassing, the amount of hydrogen contained in the amorphous silicon film 252 is reduced. For example, it is possible to attain the degassing of hydrogen in an amount of 2 atomic % or less, which is comparable to that performed by annealing using an electric furnace.

Following the degassing treatment, crystallization of the amorphous silicon film 252 is performed by using the same excimer laser 267. The laser irradiation for crystallization by using the excimer laser 267 is performed in two steps: irradiation of laser beams 273 emitted from the excimer laser 267 for alignment of polycrystalline grains in an approximately regular pattern and irradiation of laser beams 274 emitted from the excimer laser 267 for converting a polycrystalline film into a single crystal film. The energy density of the laser beams 273 emitted from the excimer laser 267 is, for example, about 340 mJ/cm$^2$. Since the degassing treatment including dehydrogenation has been performed by the laser beams 272 emitted from the excimer laser 267, it is possible to prevent the explosion of the film during irradiation of the laser beams 273 emitted from the excimer laser 267. With this irradiation of the laser beams 273 emitted from the excimer laser 267, the amorphous silicon film 252 is first polycrystallized and then the polycrystalline grains are aligned in an approximately regular pattern (see FIG. 22). To be more specific, the irradiation of the laser beams 273 emitted from the excimer laser 267 for converting the amorphous film into the polycrystalline film can be performed by moving the excimer laser 267 in the direction shown by an arrow 271 in FIG. 25D. As a result, the amorphous silicon film 252 on the substrate 251 can be overall polycrystallized. Like the laser irradiation for dehydrogenation, the sample stage 275 may be configured as an XY-stage. In this case, the overall irradiation of the laser beams 273 emitted from the excimer laser 267 can be attained by moving the sample stage 275 within the horizontal plane while fixing the excimer laser 267. Both the laser beams 273 emitted from the excimer laser 267 and the sample stage 275 may be moved.

After the alignment of the polycrystalline grains in an approximately regular pattern by irradiation of the laser beams 273 emitted from the excimer laser 267, as shown in FIG. 25E, irradiation of the laser beams 274 emitted from the excimer laser 267 for converting the polycrystalline film into a single crystal film is performed. With this irradiation of the laser beams 274, the adjacent polycrystalline grains in the polycrystalline silicon film are bonded to each other, so that the polycrystalline silicon film is converted into a single crystal silicon film 252s. To be more specific, the irradiation of the laser beams 274 emitted from the excimer laser 267 for converting the polycrystalline film into the single crystal film can be performed by moving the excimer laser 267 in the direction shown by an arrow 271 in FIG. 25E, whereby the polycrystalline silicon film on the substrate 251 can be overall converted into the single crystal silicon film. Like the laser irradiation for dehydrogenation, the sample stage 275 may be configured as an XY-stage. In this case, the overall irradiation of the laser beams 274 emitted from the excimer laser 267 can be attained by moving the sample stage 275 within the horizontal plane while fixing the excimer laser 267. Both the laser beams 274 emitted from the excimer laser 267 and the sample stage 275 may be moved.

Finally, as shown in FIG. 25F, the discharge port 269 formed in the side portion of the laser irradiation chamber 265 is opened, and the substrate 251 having been subjected to both the degassing treatment and crystallization treatment is removed out of the laser irradiation chamber 265 through the discharge port 269.

As described above, the amorphous silicon film 252 on the substrate 251 is subjected to both the degassing treatment and the crystallization treatment by using the same excimer laser 267. According to the related art fabrication method, since the degassing treatment is performed by using an electric furnace, it takes about two hours to carry out the steps from the CVD step performed by a CVD system to the laser annealing step performed by using a laser annealing apparatus, and further it is required to open the substrate 251 to atmosphere. On the contrary, according to this embodiment, since the steps from the CVD step to the crystallization step via the degassing step can be carried out by using the same semiconductor thin film fabricating apparatus, it is possible to improve the productivity. Further, since degassing is sufficiently performed before crystallization, it is possible to prevent the explosion of the amorphous silicon film 252, and hence to produce a semiconductor thin film with a good quality.

Ninth Embodiment

Figure 26:
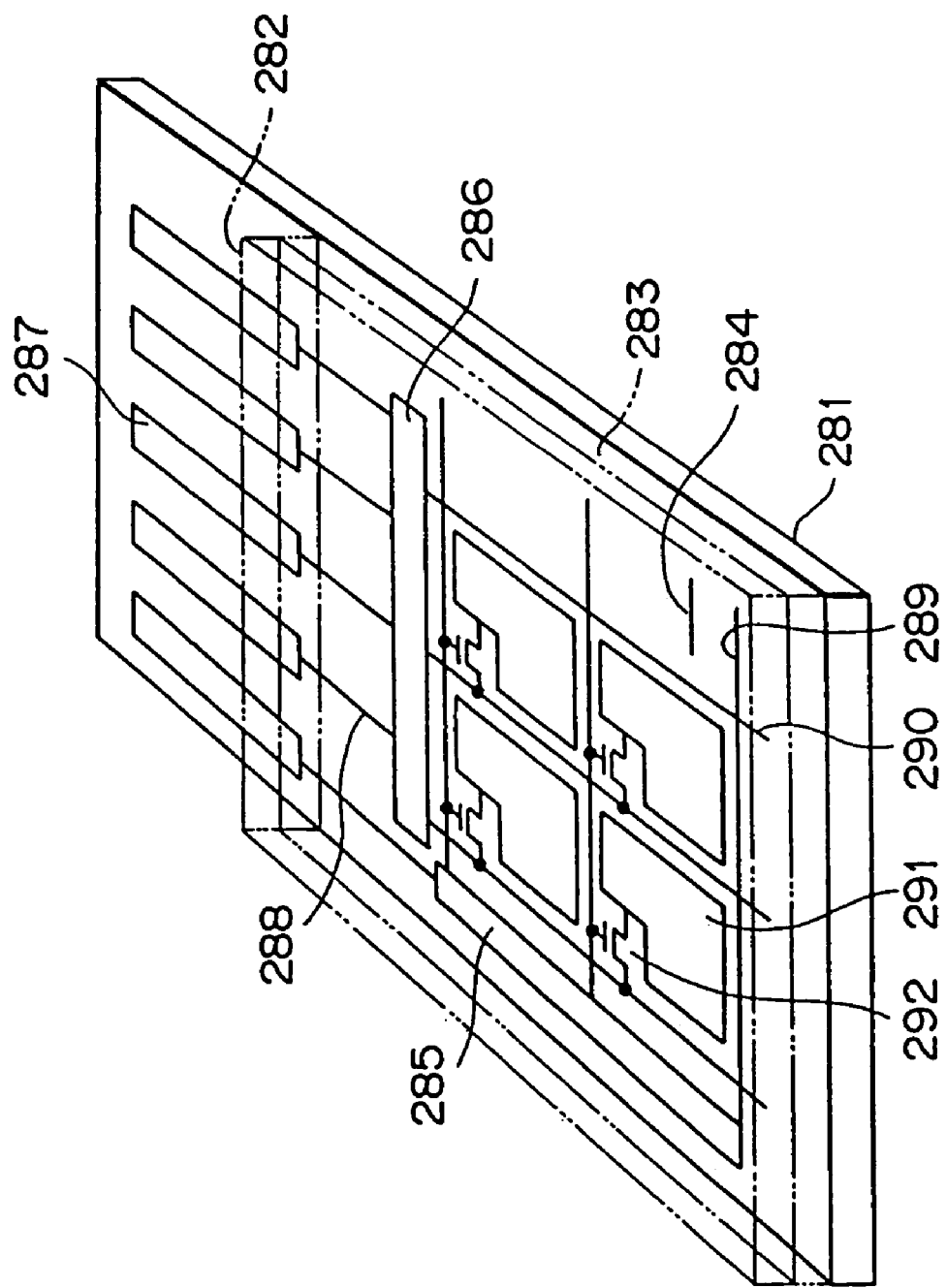
FIG. 26 is a schematic perspective view showing an active matrix type display using a semiconductor device fabricated by using the single crystal thin film of the present invention.

One example of an active matrix type display as a semiconductor device, which uses a thin film transistor fabricated in accordance with the present invention, will be described below with reference to FIG. 26. In this embodiment, a thin film is produced by forming a non-single crystal film, removing hydrogen contained in the film by using an excimer laser having a pulse width of 60 nanoseconds or more, converting the non-single crystal film into a polycrystalline film in which polycrystalline grains are aligned in an approximately regular pattern, and converting the polycrystalline film into a single crystal film by bonding the polycrystalline grains to each other, and the thin film is utilized as a channel of the semiconductor device. Referring to FIG. 26, this display has a panel structure including a pair of insulating substrates 281 and 282, and an electro-optical material 283 held therebetween. For example, a liquid crystal material is used as the electro-optical material 283. A pixel array portion 284 and a drive circuit portion are collectively formed on the lower insulating substrate 281. The drive circuit portion is divided into a vertical scanner 285 and a horizontal scanner 286. Terminal portions 287 for external connection are formed at the upper end of a peripheral portion of the insulating substrate 281. The terminal portions 287 are connected to the vertical scanner 285 and the horizontal scanner 286 via wiring lines 288. Gate lines 289 arranged in rows and signal lines 290 arranged in columns are formed in the pixel array portion 284. A pixel electrode 291 and a thin film transistor 292 for driving the pixel electrode 291 are formed at each of intersections between both lines 289 and 290. A gate electrode of the thin film transistor 292 is connected to the corresponding gate line 289. A drain region of the thin film transistor 292 is connected to the corresponding pixel electrode 291, and a source region thereof is connected to the corresponding signal line 290. The gate lines 289 are connected to the vertical scanner 285, and the signal lines 290 are connected to the horizontal scanner 286. Each of the thin film transistors 292 for switchingly driving the pixel electrodes 291 and thin film transistors contained in the vertical scanner 285 and the horizontal scanner 286 is fabricated by the method in the eighth embodiment, using an excimer laser, wherein a channel portion of the thin film is obtained by forming a non-single crystal film, removing hydrogen contained in the film, converting the non-single crystal film into a polycrystalline film in which polycrystalline grains are aligned in an approximately regular pattern, and converting the polycrystalline film into a single crystal film by bonding the polycrystalline grains to each other. Further, in addition to the vertical scanner and horizontal scanner, a video driver and a timing generator can be also collectively formed in the insulating substrate 281.

As described above, according to the method of fabricating a single crystal thin film of the present invention, polycrystalline grains are aligned in an approximately regular pattern by the first heat-treatment, and crystallization is promoted by the second heat-treatment to form a single crystal thin film. As a result, in the case of fabricating a semiconductor device using such a single crystal thin film, it is possible to realize a high speed operation of the semiconductor device due to a high mobility and to suppress a variation in threshold voltage of the device. Further, since the heat-treatments can be performed for a short-time by using an excimer laser, it is possible to significantly reduce a time required for the fabrication steps.

According to the semiconductor thin film and its fabrication method of the present invention, a crystallized semiconductor thin film having micro-projections formed by the first and second heat-treatments exhibits characteristics closer to those of a single crystal, which are quite different from those of a related art polycrystalline thin film. As a result, in the case of fabricating a semiconductor device using such a single crystal thin film, it is possible to realize a high speed operation of the semiconductor device due to a high mobility and to suppress a variation in threshold voltage of the device. Further, since the heat-treatments can be performed for a short-time by using an excimer laser, it is possible to significantly reduce a time required for the fabrication steps and hence to reduce the fabrication cost.

According to the method of fabricating a semiconductor thin film and a method of fabricating a single crystal semiconductor thin film of the present invention, since hydrogen can be removed for a short-time by heat-treatment using laser irradiation, it is possible to fabricate a semiconductor thin film while preventing the explosion of the thin film, and hence to fabricate a semiconductor device with less fault and damage of the film.

According to the method of fabricating a semiconductor thin film and an apparatus for fabricating a single crystal semiconductor thin film of the present invention, since a single crystal film can be formed on an insulating substrate by laser irradiation, it is possible to easily fabricate a single crystal semiconductor thin film which has a performance very higher than that of a related art polycrystalline thin film and is suitable for fabricating a device having stable characteristics and which can be fabricated for a short-time.

According to the method of fabricating a semiconductor thin film and an apparatus for fabricating a single crystal semiconductor thin film of the present invention, since the substrate can be subjected to heat-treatments with the substrate not opened to atmosphere during the heat-treatments, it is possible to prevent partial oxidation of the film and to prevent a process from being prolonged by changing one atmosphere to another.

While the preferred embodiments of the present invention have been described using specific terms, such description is for illustrative purposes only, and it is to be understood that changes and variations may be made without departing from the spirit or scope of the following claims.

What is claimed is:

1. A semiconductor thin film comprising:
   an insulating base; and
   a single crystal thin film having micro-projections formed on said insulating base by heat treating a polycrystalline thin film formed by heat treating an amorphous semiconductor thin film, said polycrystalline thin film having polycrystalline grains aligned in a generally regular pattern forming initial micro-projections by uplift of a boundary portion among at least three of said polycrystalline grains, at least a portion of said micro-projections of said single crystal thin film being comprised of the initial micro-projections.

2. A semiconductor thin film according to claim 1, wherein said resulting micro-projections are aligned in an approximately regular pattern.

3. A semiconductor thin film according to claim 1, wherein a thickness of said semiconductor thin film is about 50 nm or less.

4. A semiconductor thin film according to claim 1, wherein a height of each of said micro-projections is about 20 nm or less.

5. A semiconductor thin film according to claim 1, wherein a diameter of each of said micro-projections is about 0.1 µm or less.

6. A semiconductor thin film according to claim 1, wherein a radius of curvature of each of said micro-projections is about 60 nm or more.

7. A semiconductor thin film according to claim 1, wherein a density of said micro-projections is about $1 \times 10^{10}$ pieces/cm$^2$ or less.

8. A semiconductor thin film according to claim 1, wherein said single crystal thin film includes a polycrystalline semiconductor region.

9. A semiconductor thin film according to claim 1, wherein said semiconductor thin film contains a single crystal region having a size of about $1 \times 10^{-8}$ cm$^2$ or more.

10. A semiconductor thin film according to claim 1, wherein said single crystal thin film includes an amorphous semiconductor region.

11. A semiconductor thin film according to claim 1, wherein said single crystal thin film forms a top surface of the semiconductor thin film.

12. A semiconductor thin film according to claim 1, wherein a size of each of said polycrystalline grains is between about 0.1 µm and about 4.0 µm.

* * * * *